United States Patent
Allen

(10) Patent No.: US 8,154,362 B2
(45) Date of Patent: Apr. 10, 2012

(54) CONSTANT IMPEDANCE FILTER

(75) Inventor: Curtis M. Allen, Grass Valley, CA (US)

(73) Assignee: 2Wire, Inc., San Jose, CA (US)

( * ) Notice: Subject to any disclaimer, the term of this patent is extended or adjusted under 35 U.S.C. 154(b) by 138 days.

(21) Appl. No.: 12/415,714

(22) Filed: Mar. 31, 2009

(65) Prior Publication Data

US 2010/0244983 A1    Sep. 30, 2010

(51) Int. Cl.
*H03H 7/01* (2006.01)
*H03H 7/06* (2006.01)

(52) U.S. Cl. .................. 333/168; 333/172; 333/181

(58) Field of Classification Search .............. 333/167, 333/168, 181, 202, 172; 327/552, 556
See application file for complete search history.

(56) References Cited

U.S. PATENT DOCUMENTS

| | | | | |
|---|---|---|---|---|
| 1,998,325 A | * | 4/1935 | Lyman, Jr. | 333/181 |
| 4,003,005 A | * | 1/1977 | Mukherjee et al. | 333/32 |
| 4,443,662 A | * | 4/1984 | Nakhla | 379/30 |
| 6,949,988 B2 | | 9/2005 | Fallahi | |

OTHER PUBLICATIONS

"Spirent Physical Layer Solutions DLS 6626 Production-Grade Single Line Simulator," Spirent Communications, Calabasas, California, USA, P/N 79-000442 Rev. A, Jan. 2006, 2 pages.
"Spirent Physical Layer Solutions DLS 6826 Multi-Line Production Wireline Simulator," Spirent Communications, Calabasas, California, USA, P/N 79-000121 Rev. C, Jun. 2006, 2 pages.
"Spirent Physical Layer Solutions DLS-6900AWGN Single Line 26AWG/PE04 Wireline Simulator," Spirent Communications, Sunnyvale, California, USA, Rev. B, Dec. 2007, 2 pages.

* cited by examiner

*Primary Examiner* — Robert Pascal
*Assistant Examiner* — Kimberly Glenn
(74) *Attorney, Agent, or Firm* — Head, Johnson & Kachigian, P.C.

(57) ABSTRACT

A method and apparatus to provide a bi-directional constant impedance filter. Embodiments include electric networks which give filter responses while presenting a constant impedance to a signal received at either an input or an output port for a plurality of frequencies.

21 Claims, 21 Drawing Sheets

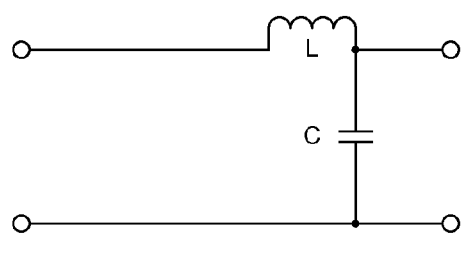
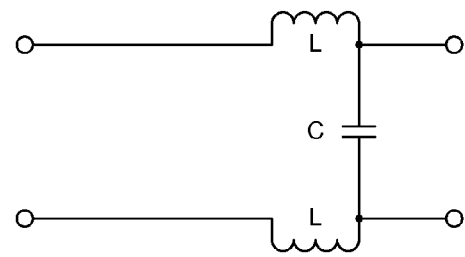
Figure 1A
Figure 1B

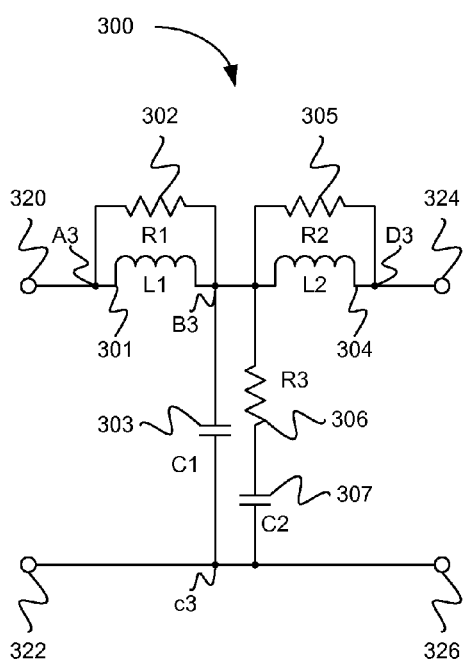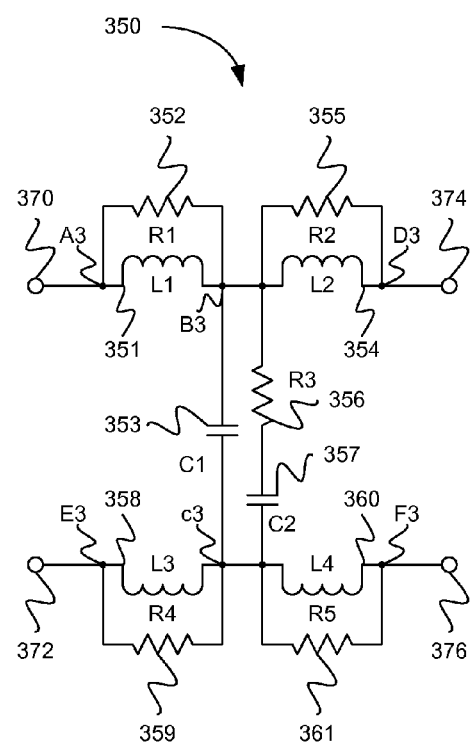
Figure 3A
Figure 3B

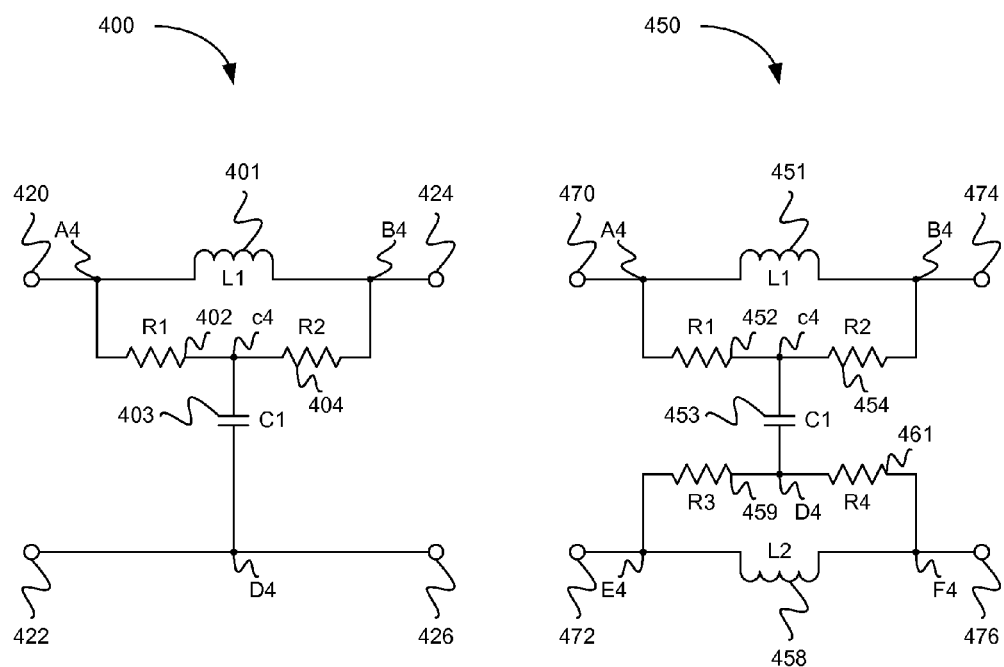
Figure 4A                    Figure 4B

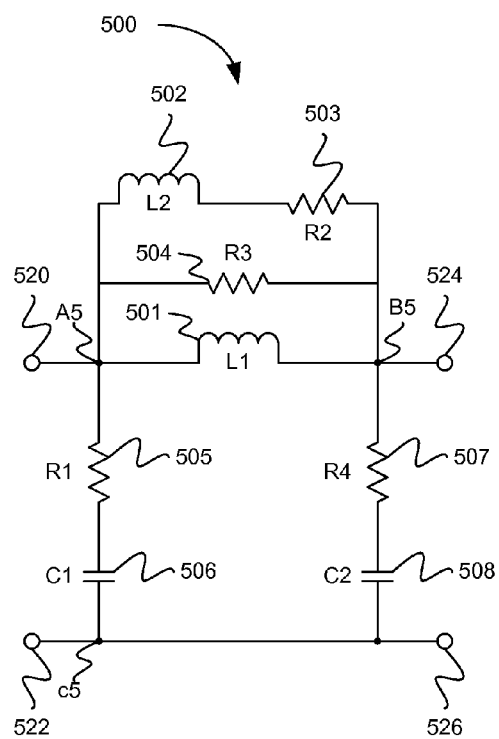
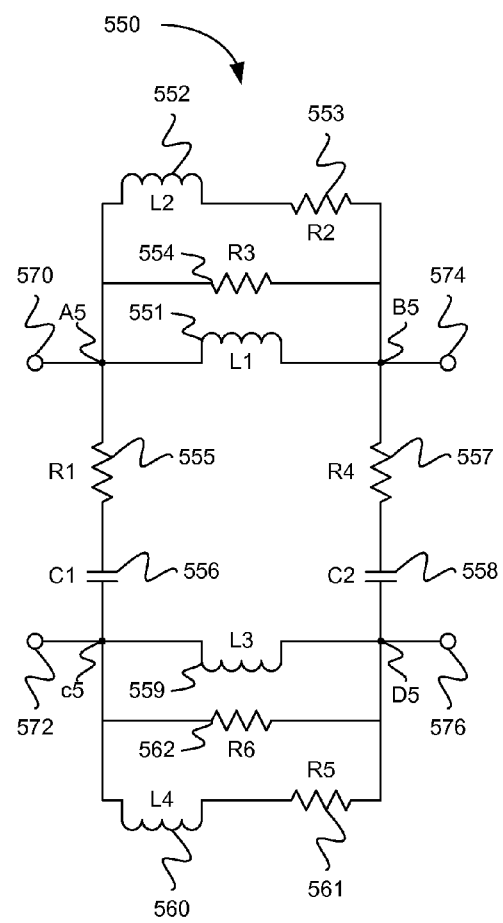
Figure 5A
Figure 5B

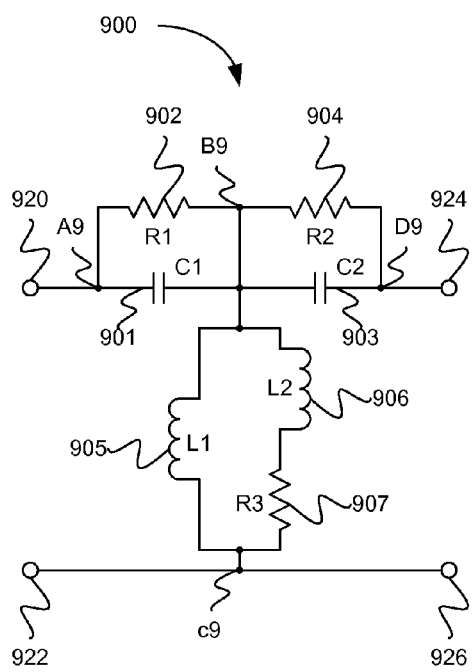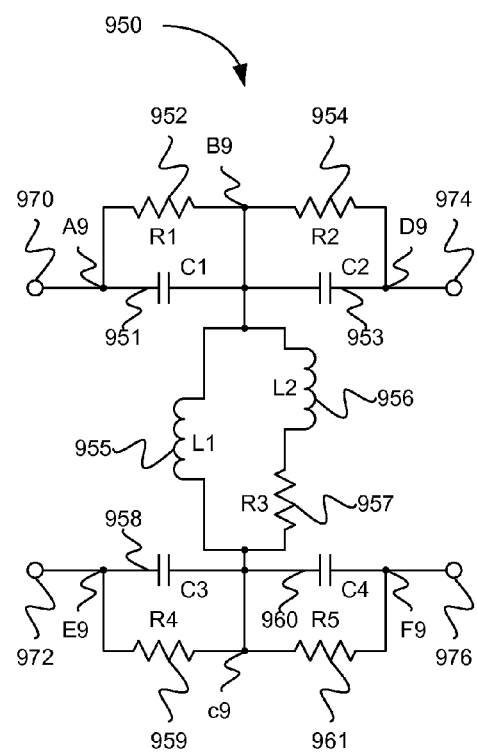
Figure 9A                    Figure 9B

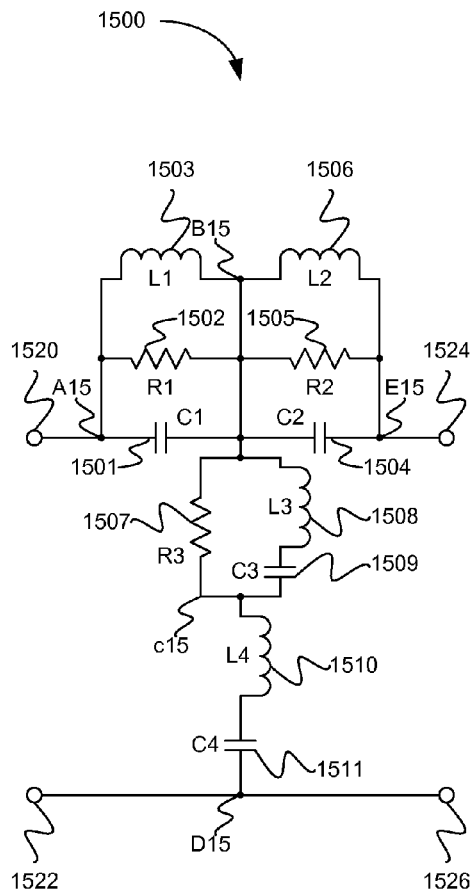
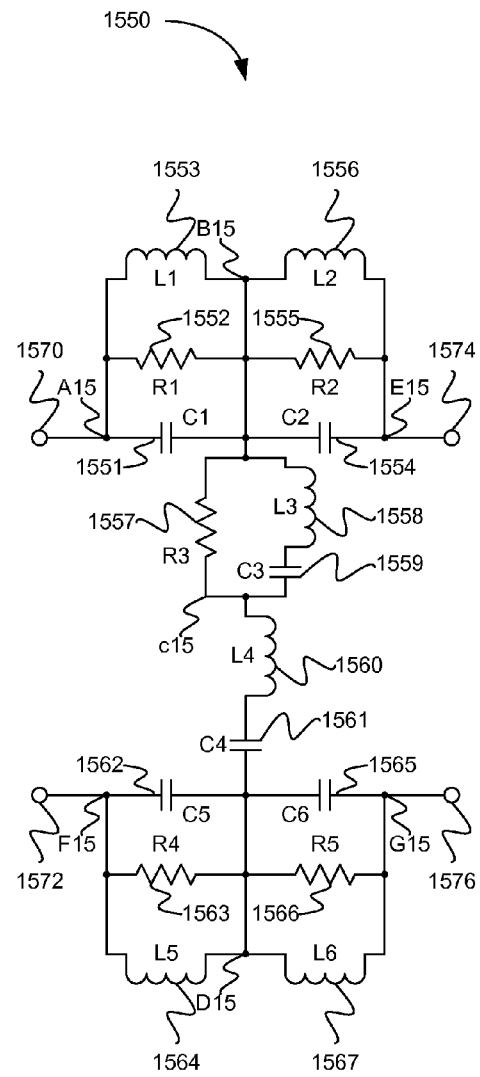
Figure 15A                    Figure 15B

CONSTANT IMPEDANCE FILTER

TECHNICAL FIELD

This invention relates to the field of electronic signal processing and, in particular, to electronic filter structures.

BACKGROUND

Many modern electronic circuits employ electronic filters to remove unwanted signal components. One conventional filter structure may include an inductor and a capacitor (an LC) circuit. FIG. 1A illustrates a conventional LC circuit. FIG. 1B illustrates an equivalent balanced differential version of the LC circuit. Electronic filters are used in a large number of applications, including bi-directional communications systems, the various types of Digital Subscriber Line (xDSL), and other digital carrier systems. xDSL may include, for example, asymmetric digital subscriber line (ADSL), high-speed digital subscriber line (HDSL) and very high-speed digital subscriber line (VDSL) systems.

In general, electronic filters see at least two sets of frequencies in a received signal. One range of frequencies is allowed to pass through the filter without being attenuated and is referred to as the passband. A second range, which is filtered out and not allowed to pass through to the filter output, is referred to as the stopband. When driving a resistive load ($Z_0$), most conventional electronic filters, including those illustrated in FIGS. 1A and 1B, have the same nominal, resistive input impedance ($Z_0$) in the filter passband. Conversely, in the stopband, the input impedance becomes more purely reactive. In other words, the input voltage of the filter will vary as the frequency of the applied signal varies. This significantly impairs bi-directional communications. Additionally, if conventional electronic filters having different filter responses are coupled together in series, the filters may interact in an undesirable fashion.

BRIEF DESCRIPTION OF THE DRAWINGS

The present invention is illustrated by way of example, and not by way of limitation, in the figures of the accompanying drawings.

FIGS. 1A and 1B illustrate a convention LC circuit in single ended and balanced forms.

FIGS. 3A and 3B illustrate a bi-directional constant impedance low pass tee form filter in single ended and balanced forms.

FIGS. 4A and 4B illustrate a bi-directional constant impedance low pass bridged-tee form filter in single ended and balanced forms.

FIGS. 5A and 5B illustrate a bi-directional constant impedance pole/zero pi form filter in single ended and balanced forms.

FIGS. 9A and 9B illustrate a bi-directional constant impedance high pass tee form filter in single ended and balanced forms.

FIGS. 15A and 15B illustrate a bi-directional constant impedance bandreject (notch) tee form filter in single ended and balanced forms.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Figure 1C:
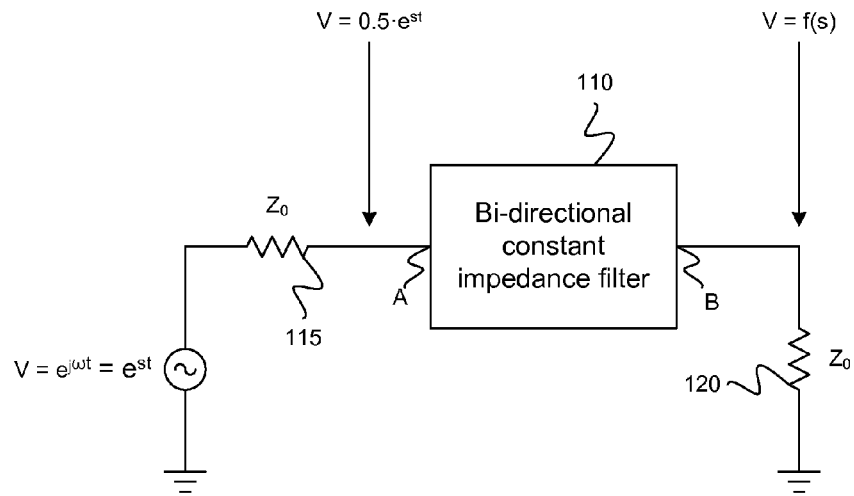
FIGS. 1C and 1D illustrate a bi-directional constant impedance filter circuit according to one embodiment of the present invention.
Figure 1D:
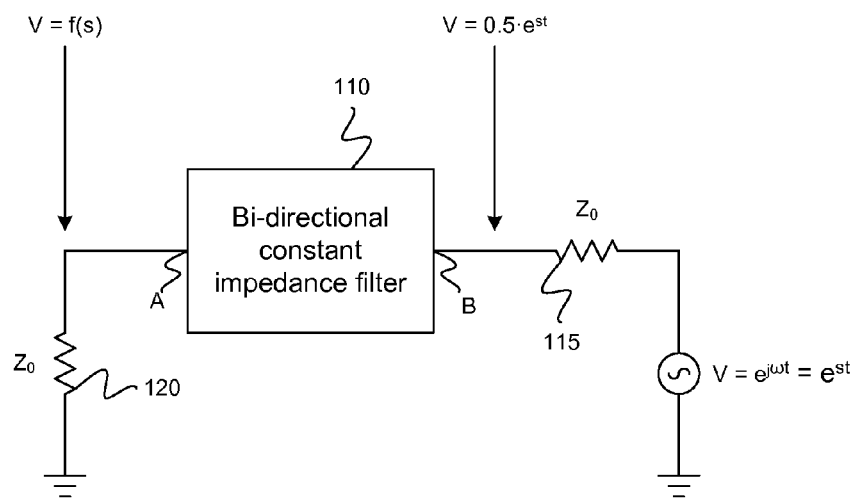

Embodiments of an apparatus are described for a bi-directional constant impedance filter structure. Embodiments include electric networks which give filter responses while presenting a constant impedance to a signal received at either an input or an output port for a plurality of frequencies. FIG. 1C illustrates a bi-directional constant impedance filter 110 according to one embodiment of the present invention. Assuming that the filter 110 is driven and loaded by an impedance $Z_0$ 115, 120, the filter 110 will present an impedance of $Z_0$ ohms to both the source (port A) and the load (port B) which is constant over a plurality of frequencies. Thus, the filter is bi-directional and either port can be connected to the source or to the load. In certain embodiments, both ports (input and output) are both source and load, as in bi-directional communication systems. For the filter 110 illustrated in FIG. 1C, the filter input voltage is one half of the open circuit source voltage over all frequencies. This characteristic is attributable to the constant impedance of the filter. In FIG. 1D, the source and load are reversed, such that the source is coupled to port B and the load to port A. The filter operation remains the same as described with respect to FIG. 1C. In certain embodiments, the bi-directional constant impedance filter may provide a filter response, such as, for example, lowpass, highpass, bandpass, band reject, pole/zero or zero/pole. In alternative embodiments, the filter may provide some other response.

Figure 2A:
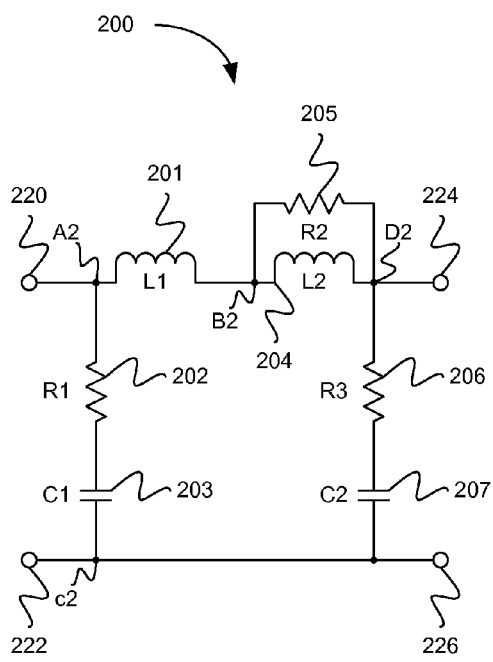
FIGS. 2A and 2B illustrate a bi-directional constant impedance low pass pi form filter in single ended and balanced forms.
Figure 2B:
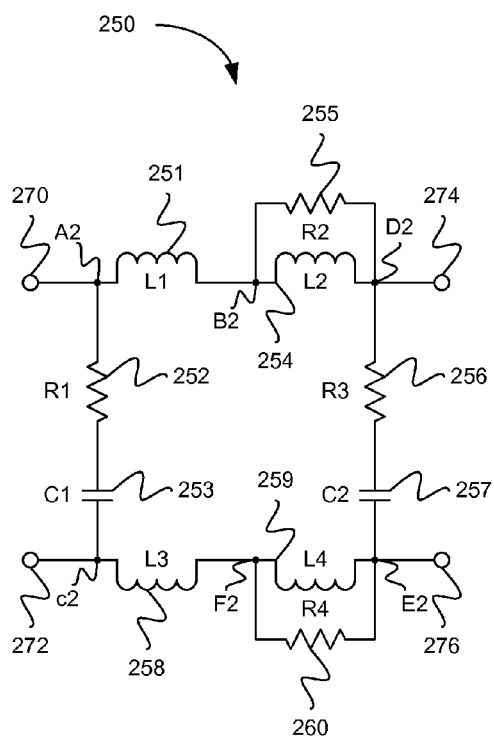

FIGS. 2A and 2B illustrate a bi-directional constant impedance low pass pi form filter in single ended and balanced forms according to one embodiment of the present invention. Circuit 200 includes inductors 201 and 204, resistors 202, 205 and 206, capacitors 203 and 207, input lines 220 and 222, and output lines 224 and 226. In one embodiment, inductor 201 is coupled between a first node A2 and a second node B2. Resistor 202 and capacitor 203 are coupled in series between the first node A2 and a third node c2. Inductor 204 and resistor 205 are coupled in parallel between the second node B2 and a fourth node D2. Resistor 206 and capacitor 207 are coupled in series between the fourth node D2 and the third node c2. Input line 220 is coupled to the first node A2, input line 222 is coupled to the third node c2, output line 224 is coupled to the fourth node D2, and output line 226 is coupled to the third node c2.

In a DSL system the driving and load impedances ($z_0$) may be approximately 100 ohms+/−10 percent. Thus, in one embodiment, the constant input impedance of each LPF section is approximately 100 ohms. In an alternative embodiment another value for $z_0$ is used. Since $z_0$ is already known, the values of the capacitors and inductors of each section will depend solely on the pole location for that section. In an embodiment where multiple LPF sections are coupled in series, the pole location for each section may be chosen so that the response of the LPF section approximates a target response to within a given threshold.

In one embodiment, the values of the components in circuit 200 may be chosen as follows. The value of the first resistor 202 equals the value of the third resistor 206 which equals:

$$R1 = R3 = z_0 \quad (1)$$

where $z_0$ is the constant input impedance.

The value of the second resistor 205 equals:

$$R2 = \frac{z_0}{2} \quad (2)$$

The values of the two inductors 201 and 204 both equal:

$$L1 = L2 = \frac{z_0}{2 \cdot \omega_C} \quad (3)$$

where $\omega_c$ is the desired pole frequency.

The value of the first capacitor 203 equals the value of the second capacitor 207 which equals:

$$C1 = C2 = \frac{1}{2 \cdot z_0 \cdot \omega_C} \quad (4)$$

These values result in a transfer response (H(s)) for the LPF section as shown in equation 5.

$$H(s) = \frac{1}{1 + \frac{s}{\omega_C}} \quad (5)$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 2B, circuit 250 includes inductors 251, 254, 258 and 259, resistors 252, 255, 256 and 260, capacitors 253 and 257, input lines 270 and 272, and output lines 274 and 276. In one embodiment, inductor 251 is coupled between a first node A2 and a second node B2. Resistor 252 and capacitor 253 are coupled in series between the first node A2 and a third node c2. Inductor 254 and resistor 255 are coupled in parallel between the second node B2 and a fourth node D2. Resistor 256 and capacitor 257 are coupled in series between the fourth node D2 and a fifth node E2. Inductor 258 is coupled between the third node c2 and a sixth node F2. Inductor 259 and resistor 260 are coupled in parallel between the fifth node E2 and the sixth node F2. Input line 270 is coupled to the first node A2, input line 272 is coupled to the third node c2, output line 274 is coupled to the fourth node D2, and output line 276 is coupled to the fifth node E2.

In one embodiment, the values of the components in circuit 250 may be chosen in a manner similar to that discussed above with respect to FIG. 2A. The component values for FIG. 2B will be similar to those in FIG. 2A with several exceptions. The first inductor 251 has an inductance value that is one half the value of inductor 201. The second, third, and fourth inductors 254, 258 and 259 have inductance values equal to the first inductor 251. The second resistor 255 has a resistance value that is one half the value of resistor 205. The fourth resistor 260 has a resistance value equal to the second resistor 255. The values of resistors 252, 256 and capacitors 254, 257 remain the same as components 202, 206, 203 and 207 respectively. Given these component values, the transfer function will be the same as shown above in equation 5.

Figure 2C:
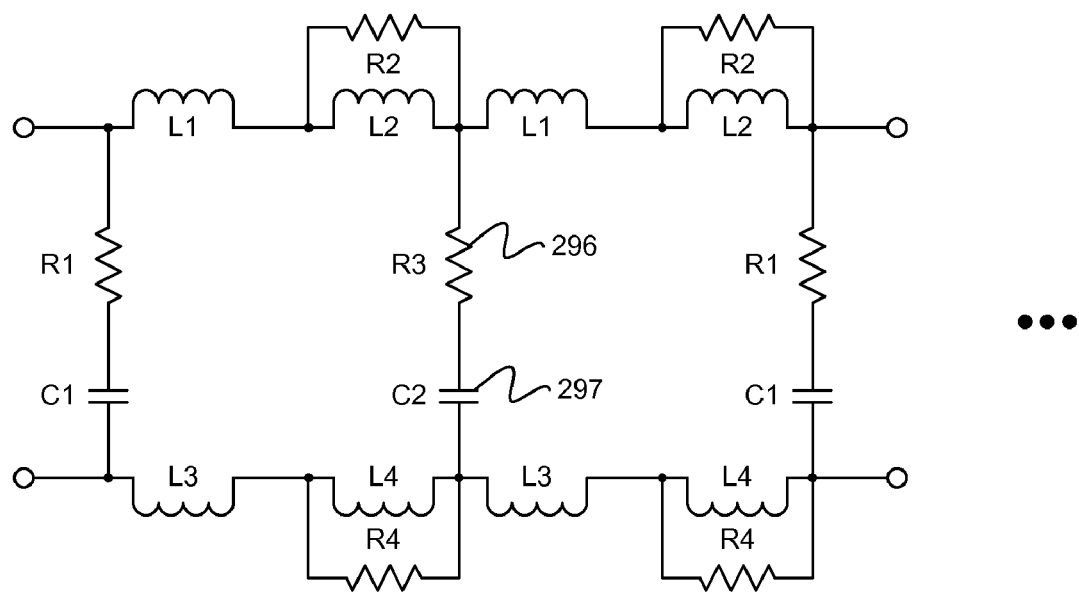
FIG. 2C illustrates one or more bi-directional constant impedance filters coupled in series.

One of more filter sections as shown in FIG. 2B may be cascaded in series. Since the sections are in cascade and are symmetric, they may be placed in any order. In one embodiment shown in FIG. 2C, identical sections (i.e. LPF sections having the same pole location and component values) are ordered together so that their equal shunt resistances (e.g. 252 or 256) and capacitances (e.g. 253 or 257) are combined into one resistor 296 in series with one capacitor 297. In alternative embodiments, only the resistors or capacitors are combined. In other alternative embodiments, filter sections having different filter responses may be cascaded in series (e.g., a LPF section in series with a pole/zero section).

FIGS. 3A and 3B illustrate a bi-directional constant impedance low pass tee form filter in single ended and balanced forms according to one embodiment of the present invention. Circuit 300 includes inductors 301 and 304, resistors 302, 305 and 306, capacitors 303 and 307, input lines 320 and 322, and output lines 324 and 326. In one embodiment, inductor 301 and resistor 302 are coupled in parallel between a first node A3 and a second node B3. Capacitor 303 and resistor 306 and capacitor 307, coupled in series, are coupled in parallel between the second node B3 and a third node c3. Inductor 304 and resistor 305 are coupled in parallel between the second node B3 and a fourth node D3. Input line 320 is coupled to the first node A3, input line 322 is coupled to the third node c3, output line 324 is coupled to the fourth node D3, and output line 326 is coupled to the third node c3.

In one embodiment, the values of the components in circuit 300 may be chosen as follows. The value of the first resistor 302 equals the value of the second resistor 305 which equals:

$$R1 = R2 = z_0 \quad (6)$$

where $z_0$ is the constant input impedance.
The value of the third resistor 306 equals:

$$R3 = 2 \cdot z_0 \quad (7)$$

The values of the two inductors 301 and 304 both equal:

$$L1 = L2 = \frac{z_0}{2 \cdot \omega_C} \quad (8)$$

where $\omega_c$ is the desired pole frequency.
The value of the first capacitor 303 equals the value of the second capacitor 307 which equals:

$$C1 = C2 = \frac{1}{2 \cdot z_0 \cdot \omega_C} \quad (9)$$

These values result in a transfer response (H(s)) for the LPF section as shown in equation 10.

$$H(s) = \frac{1}{1 + \frac{s}{\omega_C}} \quad (10)$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 3B, circuit 350 includes inductors 351, 354, 358 and 360, resistors 352, 355, 356, 359 and 361, capacitors 353 and 357, input lines 370 and 372, and output lines 374 and 376. In one embodiment, inductor 351 and resistor 352 are coupled in parallel between a first node A3 and a second node B3. Capacitor 353 and resistor 356 and capacitor 357, coupled in series, are coupled in parallel between the second node B3 and a third node c3. Inductor 354 and resistor 355 are coupled in parallel between the second node B3 and a fourth node D3. Inductor 358 and resistor 359 are coupled in parallel between the third node c3 and a fifth node E3. Inductor 360 and resistor 361 are coupled in parallel between the third node c3 and a sixth node F3. Input line 370 is coupled to the first node A3, input line 372 is coupled to the fifth node E3, output line 374 is coupled to the fourth node D3, and output line 376 is coupled to the sixth node F3.

In one embodiment, the values of the components in circuit 350 may be chosen in a manner similar to that discussed above with respect to FIG. 3A. The component values for FIG. 3B will be similar to those in FIG. 3A with several exceptions. The first inductor 351 has an inductance value that is one half the value of inductor 301. The second, third, and fourth inductors 354, 358 and 360 have inductance values equal to the first inductor 351. Resistors 352, 355, 359 and 361 have resistance values that equal to one half the value of resistor 302. The values of resistor 356 and capacitors 353 and 357 remain the same as components 306, 303 and 307 respectively. Given these component values, the transfer function will be the same as shown above in equation 10.

The bi-directional constant impedance low pass tee form filter illustrated in FIGS. 3A and 3B has a resistor in parallel with each inductor in the structure. At the limit (i.e., at infinite frequency), inductors ideally have an infinite impedance. Nevertheless, real physical inductors may have a relatively small capacitance across their windings. Thus, the inductors behave like capacitors, not inductors, at infinite frequency. This may cause what is known as parallel resonance or self resonance, which can contribute to problems with many filters in practice.

In either form of the tee structure above however, the effect of parallel resonance is mitigated by the resistor in parallel with each inductor. The resistor impedance is so much smaller than that of the parasitic capacitance (at any frequency of interest) that the latter has nearly zero effect on the network's frequency response.

FIGS. 4A and 4B illustrate a bi-directional constant impedance low pass bridged-tee form filter in single ended and balanced forms according to one embodiment of the present invention. Circuit 400 includes inductor 401, resistors 402 and 404, capacitor 403, input lines 420 and 422, and output lines 424 and 426. In one embodiment, inductor 401 is coupled between a first node A4 and a second node B4. Resistor 402 is coupled between the first node A4 and a third node c4. Capacitor 403 is coupled between the third node c4 and a fourth node D4. Resistor 404 is coupled between the second node B4 and the third node c4. Input line 420 is coupled to the first node A4, input line 422 is coupled to the fourth node D4, output line 424 is coupled to the second node B4, and output line 426 is coupled to the fourth node D4.

In one embodiment, the values of the components in circuit 400 may be chosen as follows. The value of the first resistor 402 equals the value of the second resistor 404 which equals:

$$R1 = R2 = z_0 \quad (11)$$

where $z_0$ is the constant input impedance.
The value of the inductor 401 equals:

$$L1 = \frac{z_0}{\omega_C} \quad (12)$$

where $\omega_c$ is the desired pole frequency.
The value of the capacitor 403 equals:

$$C1 = \frac{1}{z_0 \cdot \omega_C} \quad (13)$$

These values result in a transfer response (H(s)) for the LPF section as shown in equation 14.

$$H(s) = \frac{1}{1 + \frac{s}{\omega_C}} \quad (14)$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 4B, circuit 450 includes inductors 451 and 458, resistors 452, 454, 459 and 461, capacitor 453, input lines 470 and 472, and output lines 474 and 476. In one embodiment, inductor 451 is coupled between a first node A4 and a second node B4. Resistor 452 is coupled between the first node A4 and a third node c4. Capacitor 453 is coupled between the third node c4 and a fourth node D4. Resistor 454 is coupled between the second node B4 and the third node c4. Resistor 459 is coupled between the fourth node D4 and a fifth node E4. Resistor 461 is coupled between the fourth node D4 and a sixth node F4. Inductor 458 is coupled between the fifth node E4 and the sixth node F4. Input line 470 is coupled to the first node A4, input line 472 is coupled to the fifth node E4, output line 474 is coupled to the second node B4, and output line 476 is coupled to the sixth node F4.

In one embodiment, the values of the components in circuit 450 may be chosen in a manner similar to that discussed above with respect to FIG. 4A. The component values for FIG. 4B will be similar to those in FIG. 4A with several exceptions. The first inductor 451 has an inductance value that is one half the value of inductor 401. The second inductor 458 has an inductance values equal to the first inductor 451. Resistors 452, 454, 459 and 461 have resistance values that equal to one half the value of resistor 402. The value of capacitor 453 remains the same as capacitor 403. Given these component values, the transfer function will be the same as shown above in equation 14.

FIGS. 5A and 5B illustrate a bi-directional constant impedance pole/zero pi form filter in single ended and balanced forms according to one embodiment of the present invention. Circuit 500 includes inductors 501 and 502, resistors 503, 504, 505 and 507, capacitors 506 and 508, input lines 520 and 522, and output lines 524 and 526. In one embodiment, inductor 501, resistor 504 and inductor 502 and resistor 503, coupled in series, are coupled in parallel between a first node A5 and a second node B5. Resistor 505 and capacitor 506 are coupled in series between the first node A5 and a third node c5. Resistor 507 and capacitor 508 are coupled in series between the second node B5 and the third node c5. Input line 520 is coupled to the first node A5, input line 522 is coupled to the third node c5, output line 524 is coupled to the second node B5, and output line 526 is coupled to the third node c5.

In one embodiment, the values of the components in circuit 500 may be chosen as follows. The value of the first resistor 505 equals the value of the fourth resistor 507 which equals:

$$R1 = R4 = \frac{k+1}{k-1} \cdot z_0 \quad (15)$$

where $z_0$ is the constant input impedance and k is the ratio of the zero frequency to the pole frequency, where k has a value greater than one.

The value of the second resistor 503 equals:

$$R2 = 2 \cdot \frac{k+1}{k-1} \cdot z_0 \quad (16)$$

The value of the third resistor 504 equals:

$$R3 = \frac{(k^2 - 1)}{2k} \cdot z_0 \quad (17)$$

The value of the first inductor 501 equals:

$$L1 = \frac{(k-1)}{k} \cdot \frac{z_0}{\omega_C} \quad (18)$$

where $\omega_c$ is the desired pole frequency.
The value of the second inductor 502 equals:

$$L2 = \frac{(k+1)^2}{k(k-1)} \cdot \frac{z_0}{\omega_c} \quad (19)$$

The value of the first capacitor 506 equals the value of the second capacitor 508 which equals:

$$C1 = C2 = \frac{(k-1)}{2k} \cdot \frac{1}{z_0 \cdot \omega_c} \quad (20)$$

These values result in a transfer response (H(s)) for the filter as shown in equation 21.

$$H(s) = \frac{1 + \frac{s}{k \cdot \omega_c}}{1 + \frac{s}{\omega_c}} = \frac{s + k \cdot \omega_c}{k(s + \omega_c)} \quad (21)$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 5B, circuit 550 includes inductors 551, 552, 559 and 560, resistors 553, 554, 555, 557, 561 and 562, capacitors 556 and 558, input lines 570 and 572, and output lines 574 and 576. In one embodiment, inductor 551, resistor 554 and inductor 552 and resistor 553, coupled in series, are coupled in parallel between a first node A5 and a second node B5. Resistor 555 and capacitor 556 are coupled in series between the first node A5 and a third node c5. Resistor 557 and capacitor 558 are coupled in series between the second node B5 and a fourth node D5. Inductor 559, resistor 562 and inductor 560 and resistor 561, coupled in series, are coupled in parallel between the third node c5 and the fourth node D5.

Input line 570 is coupled to the first node A5, input line 572 is coupled to the third node c5, output line 574 is coupled to the second node B5, and output line 576 is coupled to the fourth node D5.

In one embodiment, the values of the components in circuit 550 may be chosen in a manner similar to that discussed above with respect to FIG. 5A. The component values for FIG. 5B will be similar to those in FIG. 5A with several exceptions. Inductors 551 and 559 have an inductance value that is one half the value of inductor 501. Inductors 552 and 560 have inductance values equal to the one half the value of inductor 502. Resistors 553 and 561 have resistance values equal to one half the value of resistor 503. Resistors 554 and 562 have resistance values that equal to one half the value of resistor 504. The values of resistors 555 and 557 and capacitors 556 and 558 remain the same as components 505, 507, 506 and 508 respectively. Given these component values, the transfer function will be the same as shown above in equation 21.

In alternative embodiments, for values of k near one, L2 and R2 can be eliminated with negligible effect. This reduces the component count in FIG. 5A to 6. Similarly, in FIG. 5B, L2, R2, L4 and R5 may be eliminated, thereby reducing the component count to 8.

Figure 6A:
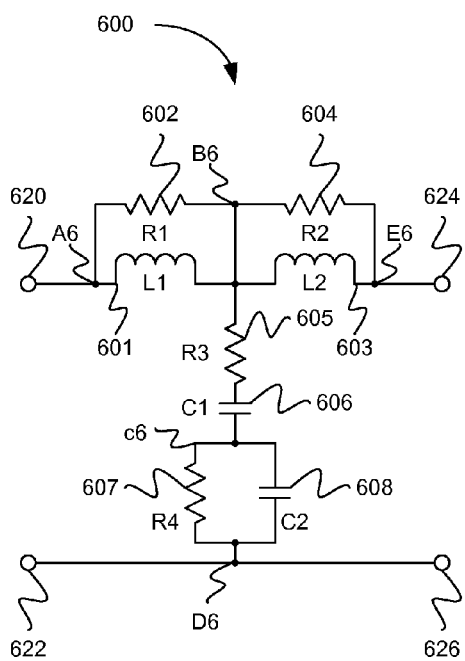
FIGS. 6A and 6B illustrate a bi-directional constant impedance pole/zero tee form filter in single ended and balanced forms.
Figure 6B:
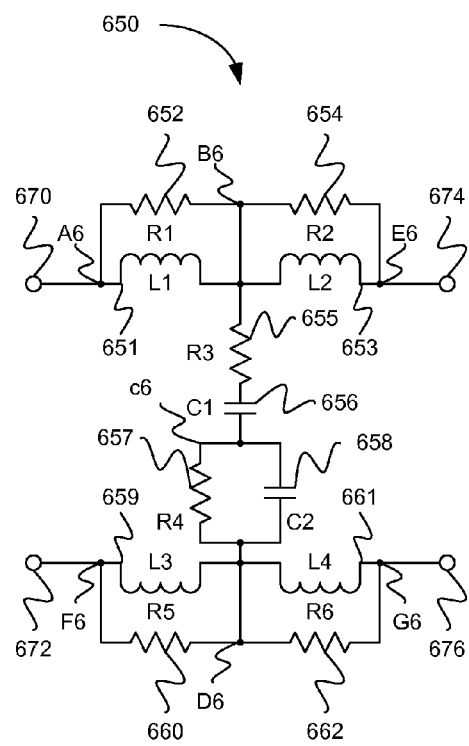

FIGS. 6A and 6B illustrate a bi-directional constant impedance pole/zero tee form filter in single ended and balanced forms according to one embodiment of the present invention. Circuit 600 includes inductors 601 and 603, resistors 602, 604, 605 and 607, capacitors 606 and 608, input lines 620 and 622, and output lines 624 and 626. In one embodiment, inductor 601 and resistor 602 are coupled in parallel between a first node A6 and a second node B6. Resistor 605 and capacitor 606 are coupled in series between the second node B6 and a third node c6. Resistor 607 and capacitor 608 are coupled in parallel between the third node c6 and a fourth node D6. Inductor 603 and resistor 604 are coupled in parallel between the second node B6 and a fifth node E6. Input line 620 is coupled to the first node A6, input line 622 is coupled to the fourth node D6, output line 624 is coupled to the fifth node E6, and output line 626 is coupled to the fourth node D6.

In one embodiment, the values of the components in circuit 600 may be chosen as follows. The value of the first resistor 602 equals the value of the second resistor 604 which equals:

$$R1 = R2 = \frac{k-1}{k+1} \cdot z_0 \tag{22}$$

where $z_0$ is the constant input impedance and k is the ratio of the zero frequency to the pole frequency where k has a value greater than one.
The value of the third resistor 605 equals:

$$R3 = \frac{2k}{k^2-1} \cdot z_0 \tag{23}$$

The value of the fourth resistor 607 equals:

$$R4 = \frac{k-1}{k+1} \cdot \frac{z_0}{2} \tag{24}$$

The value of the first inductor 601 equals the value of the second inductor 603 which equals:

$$L1 = L2 = \frac{k-1}{k} \cdot \frac{z_0}{2 \cdot \omega_c} \tag{25}$$

where $\omega_c$ is the desired pole frequency.
The value of the first capacitor 606 equals:

$$C1 = \frac{k-1}{k} \cdot \frac{1}{z_0 \cdot \omega_c} \tag{26}$$

The value of the second capacitor 608 equals:

$$C2 = \frac{(k+1)^2}{k(k-1)} \cdot \frac{1}{z_0 \cdot \omega_c} \tag{27}$$

These values result in a transfer response (H(s)) for the filter as shown in equation 28.

$$H(s) = \frac{1 + \frac{s}{k \cdot \omega_c}}{1 + \frac{s}{\omega_c}} = \frac{s + k \cdot \omega_c}{k(s + \omega_c)} \tag{28}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 6B, circuit 650 includes inductors 651, 653, 659 and 661, resistors 652, 654, 655, 657, 660 and 662, capacitors 656 and 658, input lines 670 and 672, and output lines 674 and 676. In one embodiment, inductor 651 and resistor 652 are coupled in parallel between a first node A6 and a second node B6. Resistor 655 and capacitor 656 are coupled in series between the second node B6 and a third node c6. Resistor 657 and capacitor 658 are coupled in parallel between the third node c6 and a fourth node D6. Inductor 653 and resistor 654 are coupled in parallel between the second node B6 and a fifth node E6. Inductor 659 and resistor 660 are coupled in parallel between the fourth node D6 and a sixth node F6. Inductor 661 and resistor 662 are coupled in parallel between the fourth node D6 and a seventh node G6. Input line 670 is coupled to the first node A6, input line 672 is coupled to the sixth node F6, output line 674 is coupled to the fifth node E6, and output line 676 is coupled to the seventh node G6.

In one embodiment, the values of the components in circuit 650 may be chosen in a manner similar to that discussed above with respect to FIG. 6A. The component values for FIG. 6B will be similar to those in FIG. 6A with several exceptions. Inductors 651, 653, 659 and 661 have an inductance value equal to one half the value of inductor 601. Resistors 652, 654, 660 and 662 have resistance values equal to one half the value of resistor 602. The values of resistors 655 and 657 and capacitors 656 and 658 remain the same as components 605, 607, 606 and 608 respectively. Given these component values, the transfer function will be the same as shown above in equation 28.

Figure 7A:
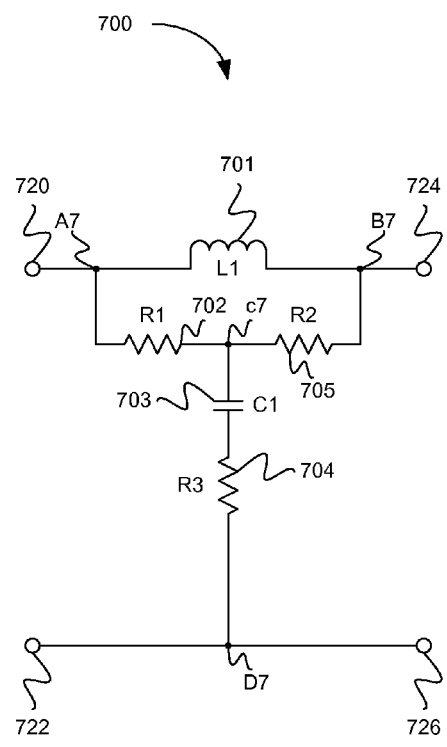
FIGS. 7A and 7B illustrate a bi-directional constant impedance pole/zero bridged-tee form filter in single ended and balanced forms.
Figure 7B:
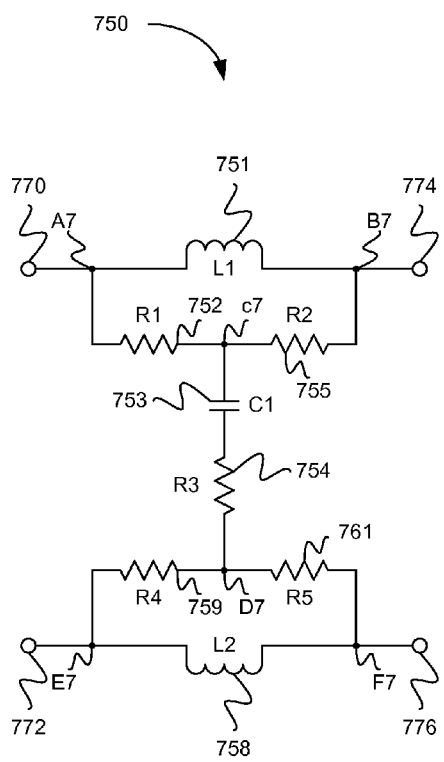

FIGS. 7A and 7B illustrate a bi-directional constant impedance pole/zero bridged-tee form filter in single ended and balanced forms according to one embodiment of the present invention. Circuit 700 includes inductor 701, resistors 702, 704, and 705, capacitor 703, input lines 720 and 722, and output lines 724 and 726. In one embodiment, inductor 701 is coupled between a first node A7 and a second node B7. Resistor 702 is coupled between the first node A7 and a third node c7. Capacitor 703 and resistor 704 are coupled in series between the third node c7 and a fourth node D7. Resistor 705 is coupled between the second node B7 and the third node c7. Input line 720 is coupled to the first node A7, input line 722 is coupled to the fourth node D7, output line 724 is coupled to the second node B7, and output line 726 is coupled to the fourth node D7.

In one embodiment, the values of the components in circuit 700 may be chosen as follows. The value of the first resistor 702 equals the value of the second resistor 705 which equals:

$$R1 = R2 = \frac{k-1}{k+1} \cdot z_0 \tag{29}$$

where $z_0$ is the constant input impedance and k is the ratio of the zero frequency to the pole frequency where k has a value greater than one.
The value of the third resistor 704 equals:

$$R3 = \frac{2k}{k^2 - 1} \cdot z_0 \tag{30}$$

The value of the first inductor 701 equals:

$$L1 = \frac{k-1}{k} \cdot \frac{z_0}{\omega_c} \tag{31}$$

where $\omega_c$ is the desired pole frequency.
The value of the first capacitor 703 equals:

$$C1 = \frac{k-1}{k} \cdot \frac{1}{z_0 \cdot \omega_c} \tag{32}$$

These values result in a transfer response (H(s)) for the filter as shown in equation 33.

$$H(s) = \frac{1 + \frac{s}{k \cdot \omega_c}}{1 + \frac{s}{\omega_c}} = \frac{s + k \cdot \omega_c}{k(s + \omega_c)} \tag{33}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 7B, circuit 750 includes inductors 751 and 758, resistors 752, 754, 755, 759 and 761, capacitor 753, input lines 770 and 772, and output lines 774 and 776. In one embodiment, inductor 751 is coupled between a first node A7 and a second node B7. Resistor 752 is coupled between the first node A7 and a third node c7. Capacitor 753 and resistor 754 are coupled in series between the third node c7 and a fourth node D7. Resistor 755 is coupled between the second node B7 and the third node c7. Resistor 759 is coupled between the fourth node D7 and a fifth node E7. Resistor 761 is coupled between the fourth node D7 and a sixth node F7. Inductor 758 is coupled between the fifth node E7 and the sixth node F7. Input line 770 is coupled to the first node A7, input line 772 is coupled to the fifth node E7, output line 774 is coupled to the second node B7, and output line 776 is coupled to the sixth node F7.

In one embodiment, the values of the components in circuit 750 may be chosen in a manner similar to that discussed above with respect to FIG. 7A. The component values for FIG. 7B will be similar to those in FIG. 7A with several exceptions. Inductors 751 and 758 have an inductance value that is one half the value of inductor 701. Resistors 752, 755, 759 and 761 have resistance values equal to one half the value of resistor 702. The values of resistor 754 and capacitor 753 remain the same as components 704 and 703 respectively. Given these component values, the transfer function will be the same as shown above in equation 33.

Figure 8A:
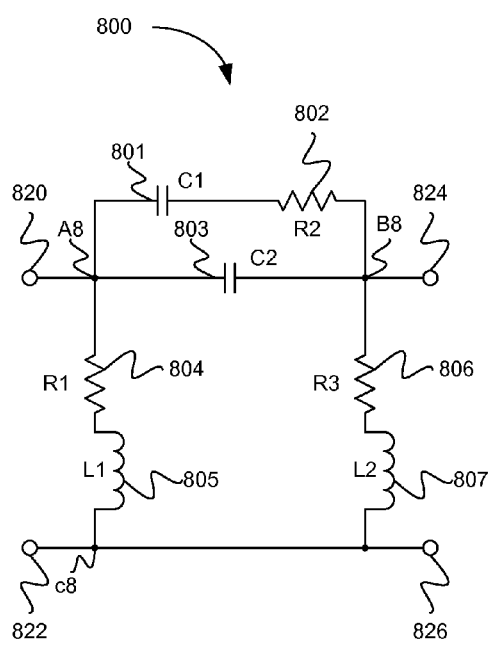
FIGS. 8A and 8B illustrate a bi-directional constant impedance high pass pi form filter in single ended and balanced forms.
Figure 8B:
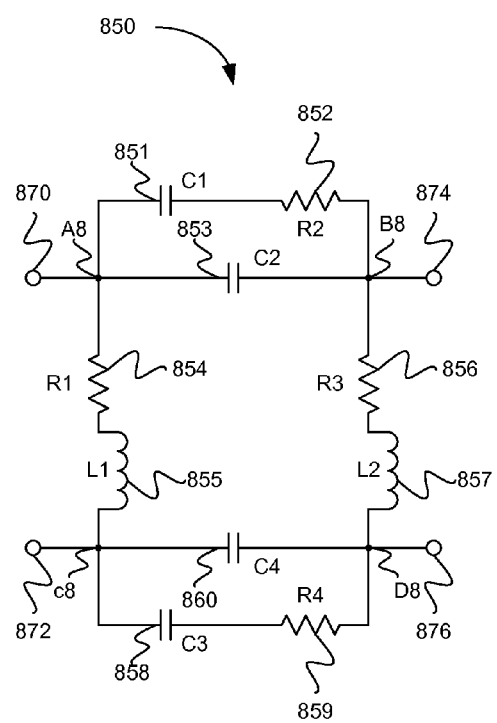

FIGS. 8A and 8B illustrate a bi-directional constant impedance high pass pi form filter in single ended and balanced forms according to one embodiment of the present invention. Circuit 800 includes inductors 805 and 807, resistors 802, 804, and 806, capacitors 801 and 803, input lines 820 and 822, and output lines 824 and 826. In one embodiment, capacitor 803 and capacitor 801 and resistor 802, coupled in series, are coupled in parallel between a first node A8 and a second node B8. Resistor 804 and inductor 805 are coupled in series between the first node A8 and a third node c8. Resistor 806 and inductor 807 are coupled in series between the second node B8 and the third node c8. Input line 820 is coupled to the first node A8, input line 822 is coupled to the third node c8, output line 824 is coupled to the second node B8, and output line 826 is coupled to the third node c8.

In one embodiment, the values of the components in circuit 800 may be chosen as follows. The value of the first resistor 804 equals the value of the third resistor 806 which equals:

$$R1 = R3 = z_0 \tag{34}$$

where $z_0$ is the constant input impedance.
The value of the second resistor 802 equals:

$$R2 = 2 \cdot z_0 \tag{35}$$

The value of the first inductor 805 equals the value of the second inductor 807 which equals:

$$L1 = L2 = \frac{2z_0}{\omega_c} \tag{36}$$

where $\omega_c$ is the desired pole frequency.
The value of the first capacitor 801 equals the value of the second capacitor 803 which equals:

$$C1 = C2 = \frac{1}{z_0 \cdot \omega_c} \tag{37}$$

These values result in a transfer response (H(s)) for the filter as shown in equation 38.

$$H(s) = \frac{s}{s + \omega_c} \tag{38}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 8B, circuit 850 includes inductors 855 and 857, resistors 852, 854, 856 and 859, capacitors 851, 853, 858 and 860, input lines 870 and 872, and output lines 874 and 876. In one embodiment, capacitor 853 and capacitor 851 and resistor 852, coupled in series, are coupled in parallel between a first node A8 and a second node B8. Resistor 854 and inductor 855 are coupled in series between the first node A8 and a third node c8. Resistor 856 and inductor 857 are coupled in series between the second node B8 and a fourth node D8. Capacitor 860 and capacitor 858 and resistor 859, coupled in series, are coupled in parallel between the third node c8 and the fourth node D8. Input line 870 is coupled to the first node A8, input line 872 is coupled to the third node c8, output line 874 is coupled to the second node B8, and output line 876 is coupled to the fourth node D8.

In one embodiment, the values of the components in circuit 850 may be chosen in a manner similar to that discussed above with respect to FIG. 8A. The component values for FIG. 8B will be similar to those in FIG. 8A with several exceptions. Capacitors 851, 853, 858 and 860 have a capacitance value that is two times the value of capacitor 801. Resistors 852 and 859 have resistance values equal to one half the value of resistor 802. The values of resistors 854 and 856 and inductors 855 and 857 remain the same as components 804, 806, 805 and 807 respectively. Given these component values, the transfer function will be the same as shown above in equation 38.

FIGS. 9A and 9B illustrate a bi-directional constant impedance high pass tee form filter in single ended and balanced forms according to one embodiment of the present invention. Circuit 900 includes inductors 905 and 906, resistors 902, 904, and 907, capacitors 901 and 903, input lines 920 and 922, and output lines 924 and 926. In one embodiment, capacitor 901 and resistor 902 are coupled in parallel between a first node A9 and a second node B9. Inductor 905 and inductor 906 and resistor 907, coupled in series, are coupled in parallel between the second node B9 and a third node c9. Capacitor 903 and resistor 904 are coupled in parallel between the second node B9 and a fourth node D9. Input line 920 is coupled to the first node A9, input line 922 is coupled to the third node c9, output line 924 is coupled to the fourth node D9, and output line 926 is coupled to the third node c9.

In one embodiment, the values of the components in circuit 900 may be chosen as follows. The value of the first resistor 902 equals the value of the second resistor 904 which equals:

$$R1 = R2 = z_0 \tag{39}$$

where $z_0$ is the constant input impedance.
The value of the third resistor 907 equals:

$$R3 = 2 \cdot z_0 \tag{40}$$

The value of the first inductor 905 equals the value of the second inductor 906 which equals:

$$L1 = L2 = \frac{2z_0}{\omega_c} \tag{41}$$

where $\omega_c$ is the desired pole frequency.
The value of the first capacitor 901 equals the value of the second capacitor 903 which equals:

$$C1 = C2 = \frac{2}{z_0 \cdot \omega_c} \tag{42}$$

These values result in a transfer response (H(s)) for the filter as shown in equation 43.

$$H(s) = \frac{s}{s + \omega_c} \tag{43}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 9B, circuit 950 includes inductors 955 and 956, resistors 952, 954, 957, 959 and 961, capacitors 951, 953, 958 and 960, input lines 970 and 972, and output lines 974 and 976. In one embodiment, capacitor 951 and resistor 952 are coupled in parallel between a first node A9 and a second node B9. Inductor 955 and inductor 956 and resistor 957, coupled in series, are coupled in parallel between the second node B9 and a third node c9. Capacitor 953 and resistor 954 are coupled in parallel between the second node B9 and a fourth node D9. Capacitor 958 and resistor 959 are coupled in parallel between the third node c9 and a fifth node E9. Capacitor 960 and resistor 961 are coupled in parallel between the third node c9 and a sixth node F9. Input line 970 is coupled to the first node A9, input line 972 is coupled to the fifth node E9, output line 974 is coupled to the fourth node D9, and output line 976 is coupled to the sixth node F9.

In one embodiment, the values of the components in circuit 950 may be chosen in a manner similar to that discussed above with respect to FIG. 9A. The component values for FIG. 9B will be similar to those in FIG. 9A with several exceptions. Capacitors 951, 953, 958 and 960 have a capacitance value that is two times the value of capacitor 901. Resistors 952, 954, 959 and 961 have resistance values equal to one half the value of resistor 902. The values of resistor 957 and inductors 955 and 956 remain the same as components 907, 905 and 906 respectively. Given these component values, the transfer function will be the same as shown above in equation 43.

Figures 10A, 10B:
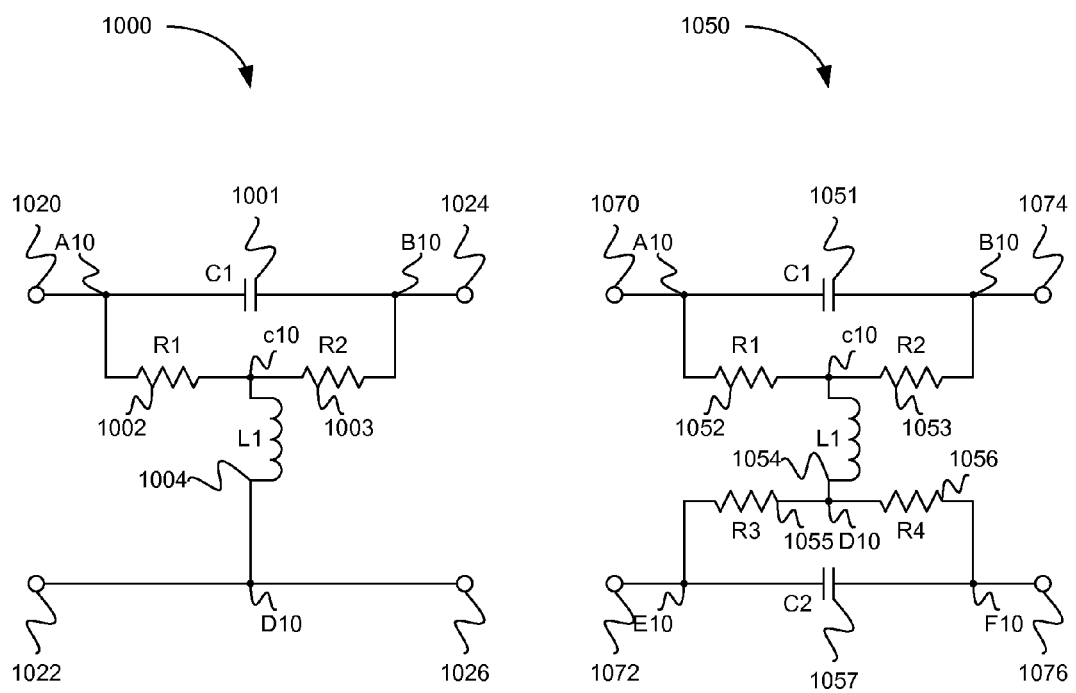
FIGS. 10A and 10B illustrate a bi-directional constant impedance high pass bridged-tee form filter in single ended and balanced forms.

FIGS. 10A and 10B illustrate a bi-directional constant impedance high pass bridged-tee form filter in single ended and balanced forms according to one embodiment of the present invention. Circuit 1000 includes inductor 1004, resistors 1002, and 1003, capacitor 1001, input lines 1020 and 1022, and output lines 1024 and 1026. In one embodiment, capacitor 1001 is coupled between a first node A10 and a second node B10. Resistor 1002 is coupled between the first node A10 and a third node c10. Inductor 1004 is coupled between the third node c10 and a fourth node D10. Resistor 1003 is coupled between the second node B10 and the third node c10. Input line 1020 is coupled to the first node A10, input line 1022 is coupled to the fourth node D10, output line 1024 is coupled to the second node B10, and output line 1026 is coupled to the fourth node D10.

In one embodiment, the values of the components in circuit 1000 may be chosen as follows. The value of the first resistor 1002 equals the value of the third resistor 1003 which equals:

$$R1 = R2 = z_0 \qquad (44)$$

where $z_0$ is the constant input impedance.
The value of the first inductor 1004 equals:

$$L1 = \frac{z_0}{\omega_c} \qquad (45)$$

where $\omega_c$ is the desired pole frequency.
The value of the first capacitor 1001 equals:

$$C1 = \frac{1}{z_0 \cdot \omega_c} \qquad (46)$$

These values result in a transfer response ($H(s)$) for the filter as shown in equation 47.

$$H(s) = \frac{s}{s + \omega_c} \qquad (47)$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 10B, circuit 1050 includes inductor 1054, resistors 1052, 1053, 1055 and 1056, capacitors 1051 and 1057, input lines 1070 and 1072, and output lines 1074 and 1076. In one embodiment, capacitor 1051 is coupled between a first node A10 and a second node B10. Resistor 1052 is coupled between the first node A10 and a third node c10. Inductor 1054 is coupled between the third node c10 and a fourth node D10. Resistor 1053 is coupled between the second node B10 and the third node c10. Resistor 1055 is coupled between the fourth node D10 and a fifth node E10. Resistor 1056 is coupled between the fourth node D10 and a sixth node F10. Capacitor 1057 is coupled between the fifth node E10 and the sixth node F10. Input line 1070 is coupled to the first node A10, input line 1072 is coupled to the fifth node E10, output line 1074 is coupled to the second node B10, and output line 1076 is coupled to the sixth node F10.

In one embodiment, the values of the components in circuit 1050 may be chosen in a manner similar to that discussed above with respect to FIG. 10A. The component values for FIG. 10B will be similar to those in FIG. 10A with several exceptions. Capacitors 1051 and 1057 have a capacitance value that is two times the value of capacitor 1001. Resistors 1052, 1053, 1055 and 1056 have resistance values equal to one half the value of resistor 1002. The value of inductor 1054 remains the same as that of inductor 1004. Given these component values, the transfer function will be the same as shown above in equation 47.

Figure 11A:
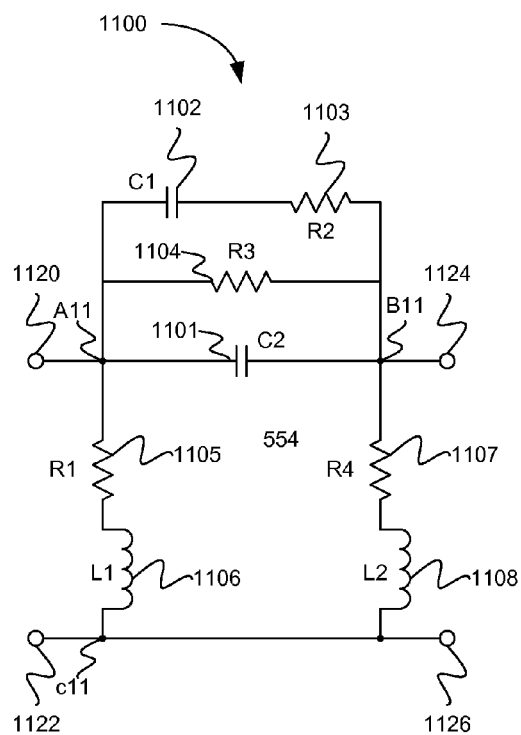
FIGS. 11A and 11B illustrate a bi-directional constant impedance zero/pole pi form filter in single ended and balanced forms.
Figure 11B:
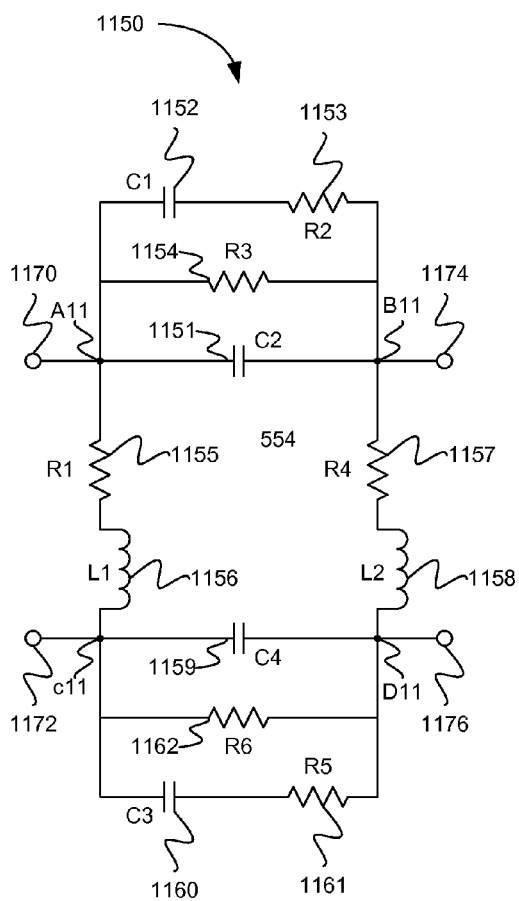

FIGS. 11A and 11B illustrate a bi-directional constant impedance zero/pole pi form filter in single ended and balanced forms according to one embodiment of the present invention. Circuit 1100 includes inductors 1106 and 1108, resistors 1103, 1104, 1105 and 1107, capacitors 1101 and 1102, input lines 1120 and 1122, and output lines 1124 and 1126. In one embodiment, capacitor 1101, resistor 1104 and capacitor 1102 and resistor 1103, coupled in series, are coupled in parallel between a first node A11 and a second node B11. Resistor 1105 and inductor 1106 are coupled in series between the first node A11 and a third node c11. Resistor 1107 and inductor 1108 are coupled in series between the second node B11 and the third node c11. Input line 1120 is coupled to the first node A11, input line 1122 is coupled to the third node c11, output line 1124 is coupled to the second node B11, and output line 1126 is coupled to the third node c11.

In one embodiment, the values of the components in circuit 1100 may be chosen as follows. The value of the first resistor 1105 equals the value of the fourth resistor 1107 which equals:

$$R1 = R4 = \frac{k+1}{k-1} \cdot z_0 \qquad (48)$$

where $z_0$ is the constant input impedance and k is the ratio of the zero frequency to the pole frequency where k has a value greater than one.
The value of the second resistor 1103 equals:

$$R2 = 2 \cdot \frac{k+1}{k-1} \cdot z_0 \qquad (49)$$

The value of the third resistor 1104 equals:

$$R3 = \frac{(k^2 - 1)}{2k} \cdot z_0 \qquad (50)$$

The value of the first inductor 1106 equals the value of the second inductor 1108 which equals:

$$L1 = L2 = \frac{1}{k-1} \cdot \frac{z_0}{\omega_c} \qquad (51)$$

where $\omega_c$ is the desired pole frequency.
The value of the first capacitor 1102 equals:

$$C1 = \frac{(k-1)}{(k+1)^2} \cdot \frac{1}{z_0 \cdot \omega_c} \qquad (52)$$

The value of the second capacitor 1101 equals:

$$C2 = \frac{1}{k-1} \cdot \frac{1}{z_0 \cdot \omega_c} \qquad (53)$$

These values result in a transfer response (H(s)) for the filter as shown in equation 54.

$$H(s) = \frac{s + \omega_c}{s + k \cdot \omega_c} \quad (54)$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 11B, circuit 1150 includes inductors 1156 and 1158, resistors 1153, 1154, 1155, 1157, 1161 and 1162, capacitors 1151, 1152, 1159 and 1160, input lines 1170 and 1172, and output lines 1174 and 1176. In one embodiment, capacitor 1151, resistor 1154 and capacitor 1152 and resistor 1153, coupled in series, are coupled in parallel between a first node A11 and a second node B11. Resistor 1155 and inductor 1156 are coupled in series between the first node A11 and a third node c11. Resistor 1157 and inductor 1158 are coupled in series between the second node B11 and a fourth node D11. Capacitor 1159, resistor 1162 and capacitor 1160 and resistor 1161, coupled in series, are coupled in parallel between the third node c11 and the fourth node D11. Input line 1170 is coupled to the first node A11, input line 1172 is coupled to the third node c11, output line 1174 is coupled to the second node B11, and output line 1176 is coupled to the fourth node D11.

In one embodiment, the values of the components in circuit 1150 may be chosen in a manner similar to that discussed above with respect to FIG. 11A. The component values for FIG. 11B will be similar to those in FIG. 11A with several exceptions. Capacitors 1151 and 1159 have a capacitance value that is two times the value of capacitor 1101. Capacitors 1152 and 1160 have a capacitance value that is two times the value of capacitor 1102. Resistors 1153 and 1161 have resistance values equal to one half the value of resistor 1103. Resistors 1154 and 1162 have resistance values equal to one half the value of resistor 1104. The values of resistors 1155 and 1157 and inductors 1156 and 1158 remain the same as components 1105, 1107, 1106 and 1108 respectively. Given these component values, the transfer function will be the same as shown above in equation 54.

In alternative embodiments, for values of k near one, C1 and R2 can be eliminated with negligible effect. This reduces the component count in FIG. 11A to 6. Similarly, in FIG. 11B, C1, R2, C3 and R5 may be eliminated, thereby reducing the component count to 8.

Figure 12A:
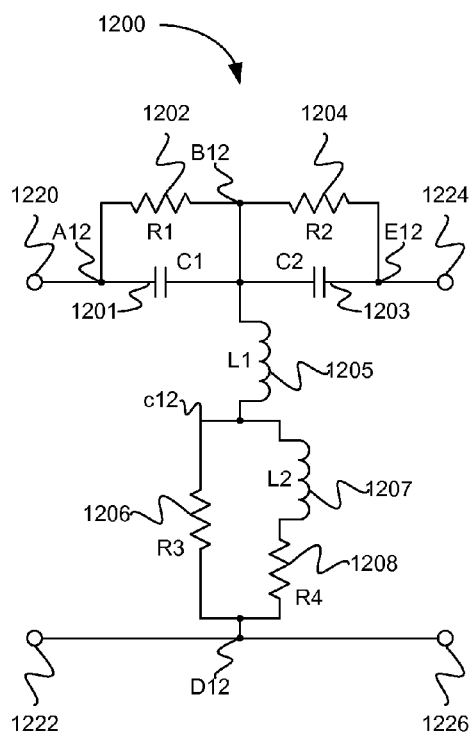
FIGS. 12A and 12B illustrate a bi-directional constant impedance zero/pole tee form filter in single ended and balanced forms.
Figure 12B:
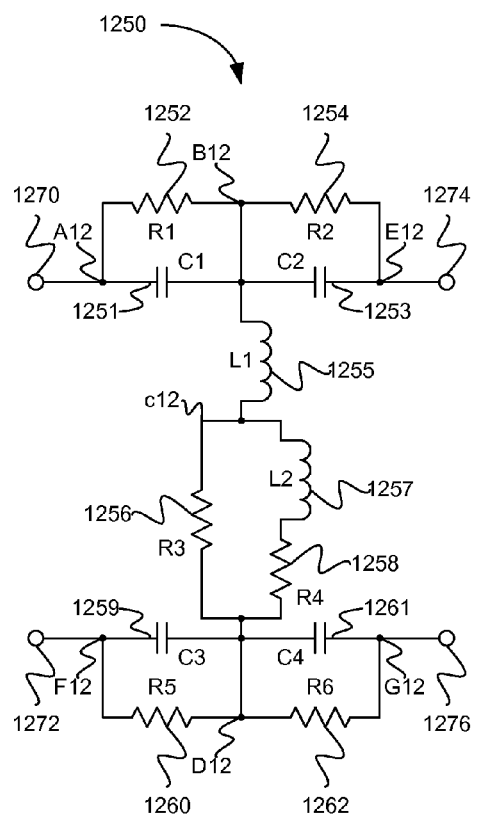

FIGS. 12A and 12B illustrate a bi-directional constant impedance zero/pole tee form filter in single ended and balanced forms according to one embodiment of the present invention. Circuit 1200 includes inductors 1205 and 1207, resistors 1202, 1204, 1206 and 1208, capacitors 1201 and 1203, input lines 1220 and 1222, and output lines 1224 and 1226. In one embodiment, capacitor 1201 and resistor 1202 are coupled in parallel between a first node A12 and a second node B12. Inductor 1205 is coupled between the second node B12 and a third node c12. Resistor 1206 and inductor 1207 and resistor 1208, coupled in series, are coupled in parallel between the third node c12 and a fourth node D12. Capacitor 1203 and resistor 1204 are coupled in parallel between the second node B12 and a fifth node E12. Input line 1220 is coupled to the first node A12, input line 1222 is coupled to the fourth node D12, output line 1224 is coupled to the fifth node E12, and output line 1226 is coupled to the fourth node D12.

In one embodiment, the values of the components in circuit 1200 may be chosen as follows. The value of the first resistor 1202 equals the value of the second resistor 1204 which equals:

$$R1 = R2 = \frac{k-1}{k+1} \cdot z_0 \quad (55)$$

where $z_0$ is the constant input impedance and k is the ratio of the zero frequency to the pole frequency where k has a value greater than one.

The value of the third resistor 1206 equals:

$$R3 = \frac{k+1}{k-1} \cdot \frac{z_0}{2} \quad (56)$$

The value of the fourth resistor 1208 equals:

$$R4 = \frac{k(k+1)}{(k-1)^3} \cdot 2z_0 \quad (57)$$

The value of the first inductor 1205 equals:

$$L1 = \frac{1}{k-1} \cdot \frac{z_0}{\omega_c} \quad (58)$$

where $\omega_c$ is the desired pole frequency.

The value of the second inductor 1207 equals:

$$L2 = \frac{(k+1)^2}{(k-1)^3} \cdot \frac{z_0}{\omega_c} \quad (59)$$

The value of the first capacitor 1201 equals the value of the second capacitor 1203 which equals:

$$C1 = C2 = \frac{2}{k-1} \cdot \frac{1}{z_0 \cdot \omega_c} \quad (60)$$

These values result in a transfer response (H(s)) for the filter as shown in equation 61.

$$H(s) = \frac{s + \omega_c}{s + k \cdot \omega_c} \quad (61)$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 12B, circuit 1250 includes inductors 1255 and 1257, resistors 1252, 1254, 1256, 1258, 1260 and 1262, capacitors 1251, 1253, 1259 and 1261, input lines 1270 and 1272, and output lines 1274 and 1276. In one embodiment, capacitor 1251 and resistor 1252 are coupled in parallel between a first node A12 and a second node B12. Inductor 1255 is coupled between the second node B12 and a third node c12. Resistor 1256 and inductor 1257 and resistor 1258, coupled in series, are coupled in parallel between the third node c12 and a fourth node D12. Capacitor 1253 and resistor 1254 are coupled in parallel between the second node B12 and a fifth node E12. Capacitor 1259 and resistor 1260 are coupled in parallel between the fourth node D12 and a sixth node F12. Capacitor 1261 and resistor 1262 are coupled in parallel between the fourth node D12 and a seventh node G12. Input line 1270 is coupled to the first node A12, input line 1272 is coupled to the sixth node F12, output line 1274 is coupled to the fifth node E12, and output line 1276 is coupled to the seventh node G12.

In one embodiment, the values of the components in circuit 1250 may be chosen in a manner similar to that discussed above with respect to FIG. 12A. The component values for FIG. 12B will be similar to those in FIG. 12A with several exceptions. Capacitors 1251, 1253, 1259 and 1261 have a capacitance value that is two times the value of capacitor 1201. Resistors 1252, 1254, 1260 and 1262 have resistance values equal to one half the value of resistor 1202. The values of inductors 1255 and 1257 and resistors 1256 and 1258 remain the same as components 1205, 1207, 1206 and 1208 respectively. Given these component values, the transfer function will be the same as shown above in equation 61.

Figure 13A:
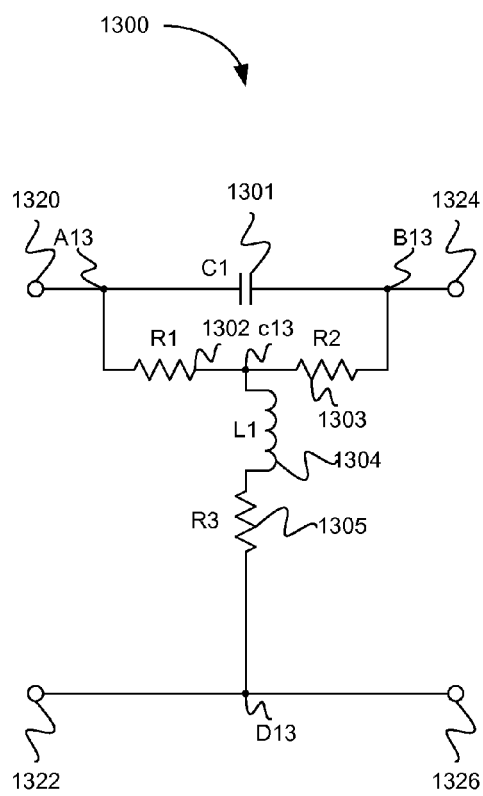
FIGS. 13A and 13B illustrate a bi-directional constant impedance zero/pole bridged-tee form filter in single ended and balanced forms.
Figure 13B:
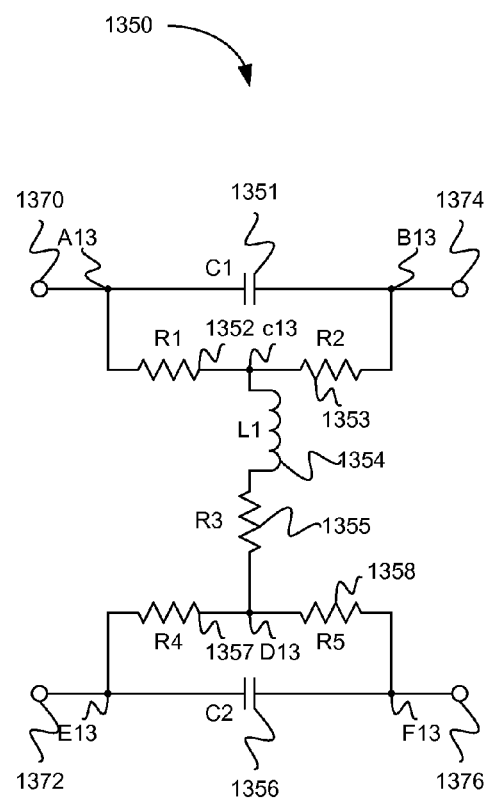

FIGS. 13A and 13B illustrate a bi-directional constant impedance zero/pole bridged-tee form filter in single ended and balanced forms according to one embodiment of the present invention. Circuit 1300 includes capacitor 1301, resistors 1302, 1303, and 1305, inductor 1304, input lines 1320 and 1322, and output lines 1324 and 1326. In one embodiment, capacitor 1301 is coupled between a first node A13 and a second node B13. Resistor 1302 is coupled between the first node A13 and a third node c13. Inductor 1304 and resistor 1305 are coupled in series between the third node c13 and a fourth node D13. Resistor 1303 is coupled between the second node B13 and the third node c13. Input line 1320 is coupled to the first node A13, input line 1322 is coupled to the fourth node D13, output line 1324 is coupled to the second node B13, and output line 1326 is coupled to the fourth node D13.

In one embodiment, the values of the components in circuit 1300 may be chosen as follows. The value of the first resistor 1302 equals the value of the second resistor 1303 which equals:

$$R1 = R2 = \frac{k-1}{k+1} \cdot z_0 \tag{62}$$

where $z_0$ is the constant input impedance and k is the ratio of the zero frequency to the pole frequency, where k has a value greater than one.
The value of the third resistor 1305 equals:

$$R3 = \frac{2k}{k^2 - 1} \cdot z_0 \tag{63}$$

The value of the first inductor 1304 equals:

$$L1 = \frac{1}{k-1} \cdot \frac{z_0}{\omega_c} \tag{64}$$

where $\omega_c$ is the desired pole frequency.
The value of the first capacitor 1301 equals:

$$C1 = \frac{1}{k-1} \cdot \frac{1}{z_0 \cdot \omega_c} \tag{65}$$

These values result in a transfer response (H(s)) for the filter as shown in equation 66.

$$H(s) = \frac{s + \omega_c}{s + k \cdot \omega_c} \tag{66}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 13B, circuit 1350 includes capacitors 1351 and 1356, resistors 1352, 1353, 1355, 1357 and 1358, inductor 1354, input lines 1370 and 1372, and output lines 1374 and 1376. In one embodiment, capacitor 1351 is coupled between a first node A13 and a second node B13. Resistor 1352 is coupled between the first node A13 and a third node c13. Inductor 1354 and resistor 1355 are coupled in series between the third node c13 and a fourth node D13. Resistor 1353 is coupled between the second node B13 and the third node c13. Resistor 1357 is coupled between the fourth node D13 and a fifth node E13. Resistor 1358 is coupled between the fourth node D13 and a sixth node F13. Capacitor 1356 is coupled between the fifth node E13 and the sixth node F13. Input line 1370 is coupled to the first node A13, input line 1372 is coupled to the fifth node E13, output line 1374 is coupled to the second node B13, and output line 1376 is coupled to the sixth node F13.

In one embodiment, the values of the components in circuit 1350 may be chosen in a manner similar to that discussed above with respect to FIG. 13A. The component values for FIG. 13B will be similar to those in FIG. 13A with several exceptions. Capacitors 1351 and 1356 have a capacitance value that is two times the value of capacitor 1301. Resistors 1352, 1353, 1357 and 1358 have resistance values equal to one half the value of resistor 1302. The values of inductor 1354 and resistor 1355 remain the same as components 1304 and 1305 respectively. Given these component values, the transfer function will be the same as shown above in equation 66.

Figures 14A, 14B:
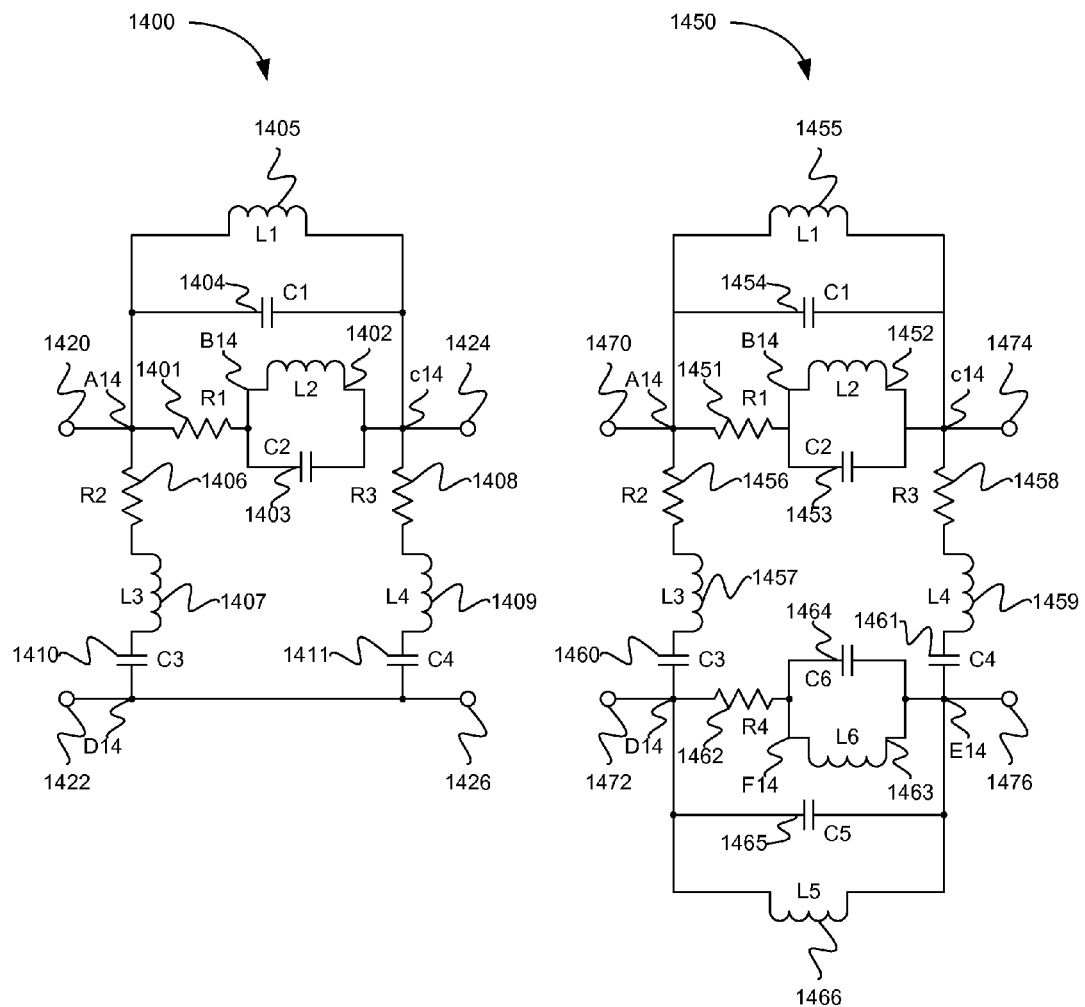
FIGS. 14A and 14B illustrate a bi-directional constant impedance bandreject (notch) pi form filter in single ended and balanced forms.

FIGS. 14A and 14B illustrate a bi-directional constant impedance bandreject (notch) pi form filter in single ended and balanced forms according to one embodiment of the present invention. Circuit 1400 includes capacitors 1403, 1404, 1410 and 1411, resistors 1401, 1406, and 1408, inductors 1402, 1405, 1407 and 1409, input lines 1420 and 1422, and output lines 1424 and 1426. In one embodiment, resistor 1401 is coupled between a first node A14 and a second node B14. Inductor 1402 and capacitor 1403 are coupled in parallel between the second node B14 and a third node c14. Inductor 1405 and capacitor 1404 are coupled in parallel between the first node A14 and the third node c14. Resistor 1406, inductor 1407 and capacitor 1410 are coupled in series between the first node A14 and a fourth node D14. Resistor 1408, inductor 1409 and capacitor 1411 are coupled in series between the third node c14 and the fourth node D14. Input line 1420 is coupled to the first node A14, input line 1422 is coupled to the fourth node D14, output line 1424 is coupled to the third node c14, and output line 1426 is coupled to the fourth node D14.

In one embodiment, the values of the components in circuit 1400 may be chosen as follows. The value of the first resistor 1401 equals:

$$R1 = 2z_0 \tag{67}$$

where $z_0$ is the constant input impedance.
The value of the second resistor 1406 equals the value of the third resistor 1408 which equals:

$$R2 = R3 = z_0 \tag{68}$$

The value of the first inductor 1405 equals the value of the second inductor 1402 which equals:

$$L1 = L2 = Q \cdot \frac{z_0}{\omega_r} \tag{69}$$

where $\omega_c$ is the desired pole frequency and Q is the quality factor of the filter. The value of the third inductor 1407 equals the value of the fourth inductor 1409 which equals:

$$L3 = L4 = \frac{2}{Q} \cdot \frac{z_0}{\omega_r} \tag{70}$$

The value of the first capacitor 1404 equals the value of the second capacitor 1403 which equals:

$$C1 = C2 = \frac{1}{Q} \cdot \frac{1}{z_0 \cdot \omega_c} \tag{71}$$

The value of the third capacitor 1410 equals the value of the fourth capacitor 1411 which equals:

$$C3 = C4 = Q \cdot \frac{1}{2 \cdot z_0 \cdot \omega_c} \tag{72}$$

These values result in a transfer response (H(s)) for the filter as shown in equation 73.

$$H(s) = \frac{s^2 + \omega_c^2}{s^2 + Q \cdot s \cdot \omega_c + \omega_c^2} \tag{73}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 14B, circuit 1450 includes capacitors 1453, 1454, 1460, 1461, 1464 and 1465, resistors 1451, 1456, 1458 and 1462, inductors 1452, 1455, 1457, 1459, 1463 and 1466, input lines 1470 and 1472, and output lines 1474 and 1476. In one embodiment, resistor 1451 is coupled between a first node A14 and a second node B 14. Inductor 1452 and capacitor 1453 are coupled in parallel between the second node B14 and a third node c14. Inductor 1455 and capacitor 1454 are coupled in parallel between the first node A14 and the third node c14. Resistor 1456, inductor 1457 and capacitor 1460 are coupled in series between the first node A14 and a fourth node D14. Resistor 1458, inductor 1459 and capacitor 1461 are coupled in series between the third node c14 and a fifth node E14. Resistor 1462 is coupled between the fourth node D14 and a sixth node F14. Inductor 1463 and capacitor 1464 are coupled in parallel between the fifth node E14 and the sixth node F14. Inductor 1466 and capacitor 1465 are coupled in parallel between the fourth node D14 and the fifth node E14. Input line 1470 is coupled to the first node A14, input line 1472 is coupled to the fourth node D14, output line 1474 is coupled to the third node c14, and output line 1476 is coupled to the fifth node E14.

In one embodiment, the values of the components in circuit 1450 may be chosen in a manner similar to that discussed above with respect to FIG. 14A. The component values for FIG. 14B will be similar to those in FIG. 14A with several exceptions. Resistors 1451 and 1462 have a resistance value that is one half the value of resistor 1401. Capacitors 1453, 1454, 1464 and 1465 have capacitance values equal to two times the value of capacitor 1403. Inductors 1452, 1455, 1463 and 1466 have inductance values equal to one half the value of inductor 1402. The values of resistors 1456 and 1458, inductors 1457 and 1459 and capacitors 1460 and 1461 remain the same as components 1406, 1408, 1407, 1409, 1410 and 1411 respectively. Given these component values, the transfer function will be the same as shown above in equation 73.

FIGS. 15A and 15B illustrate a bi-directional constant impedance bandreject (notch) tee form filter in single ended and balanced forms according to one embodiment of the present invention. Circuit 1500 includes inductors 1503, 1506, 1508 and 1510, resistors 1502, 1505 and 1507, capacitors 1501, 1504, 1509 and 1511, input lines 1520 and 1522, and output lines 1524 and 1526. In one embodiment, capacitor 1501, resistor 1502 and inductor 1503 are coupled in parallel between a first node A15 and a second node B15. Resistor 1507 and inductor 1508 and capacitor 1509, coupled in series, are coupled in parallel between the second node B15 and a third node c15. Inductor 1510 and capacitor 1511 are coupled in series between the third node c15 and a fourth node D15. Capacitor 1504, resistor 1505 and inductor 1506 are coupled in parallel between the second node B15 and a fifth node E15. Input line 1520 is coupled to the first node A15, input line 1522 is coupled to the fourth node D15, output line 1524 is coupled to the fifth node E15, and output line 1526 is coupled to the fourth node D15.

In one embodiment, the values of the components in circuit 1500 may be chosen as follows. The value of the first resistor 1502 equals the value of the second resistor 1505 which equals:

$$R1 = R2 = z_0 \tag{74}$$

where $z_0$ is the constant input impedance.

The value of the third resistor 1507 equals:

$$R3 = \frac{z_0}{2} \tag{75}$$

The value of the first inductor 1503 equals the value of the second inductor 1506 which equals:

$$L1 = L2 = \frac{Q}{2} \cdot \frac{z_0}{\omega_c} \tag{76}$$

where $\omega_c$ is the desired pole frequency and Q is the quality factor of the filter.

The value of the third inductor 1508 equals the value of the fourth inductor 1510 which equals:

$$L3 = L4 = \frac{1}{Q} \cdot \frac{z_0}{\omega_c} \tag{77}$$

The value of the first capacitor 1501 equals the value of the second capacitor 1504 which equals:

$$C1 = C2 = \frac{2}{Q} \cdot \frac{1}{z_0 \cdot \omega_c} \tag{78}$$

The value of the third capacitor 1509 equals the value of the fourth capacitor 1511 which equals:

$$C3 = C4 = Q \cdot \frac{1}{z_0 \cdot \omega_c} \tag{79}$$

These values result in a transfer response (H(s)) for the filter as shown in equation 80.

$$H(s) = \frac{s^2 + \omega_c^2}{s^2 + Q \cdot s \cdot \omega_c + \omega_c^2} \tag{80}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 15B, circuit 1550 includes inductors 1553, 1556, 1558, 1560, 1564 and 1567, resistors 1552, 1555, 1557, 1563 and 1566, capacitors 1551, 1554, 1559, 1561, 1562 and 1565, input lines 1570 and 1572, and output lines 1574 and 1576. In one embodiment, capacitor 1551, resistor 1552 and inductor 1553 are coupled in parallel between a first node A15 and a second node B15. Resistor 1557 and inductor 1558 and capacitor 1559, coupled in series, are coupled in parallel between the second node B15 and a third node c15. Inductor 1560 and capacitor 1561 are coupled in series between the third node c15 and a fourth node D15. Capacitor 1554, resistor 1555 and inductor 1556 are coupled in parallel between the second node B15 and a fifth node E15. Capacitor 1562, resistor 1563 and inductor 1564 are coupled in parallel between the fourth node D15 and a sixth node F15. Capacitor 1565, resistor 1566 and inductor 1567 are coupled in parallel between the fourth node D15 and a seventh node G15. Input line 1570 is coupled to the first node A15, input line 1572 is coupled to the sixth node F15, output line 1574 is coupled to the fifth node E15, and output line 1576 is coupled to the seventh node G15.

In one embodiment, the values of the components in circuit 1550 may be chosen in a manner similar to that discussed above with respect to FIG. 15A. The component values for FIG. 15B will be similar to those in FIG. 15A with several exceptions. Resistors 1552, 1555, 1563 and 1566 have a resistance value that is one half the value of resistor 1502. Capacitors 1551, 1554, 1562 and 1565 have capacitance values equal to two times the value of capacitor 1501. Inductors 1553, 1556, 1564 and 1567 have inductance values equal to one half the value of inductor 1503. The values of resistor 1557, inductors 1558 and 1560 and capacitors 1559 and 1561 remain the same as components 1507, 1508, 1510, 1509 and 1511 respectively. Given these component values, the transfer function will be the same as shown above in equation 80.

Figure 16A:
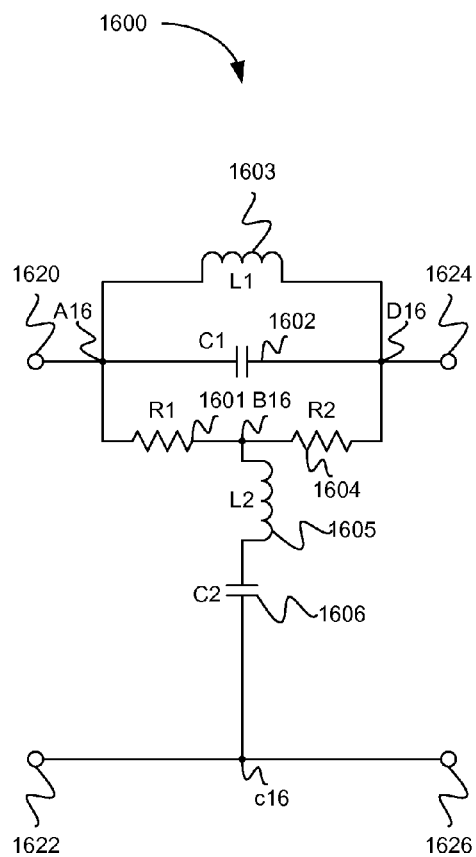
FIGS. 16A and 16B illustrate a bi-directional constant impedance bandreject (notch) bridged-tee form filter in single ended and balanced forms.
Figure 16B:
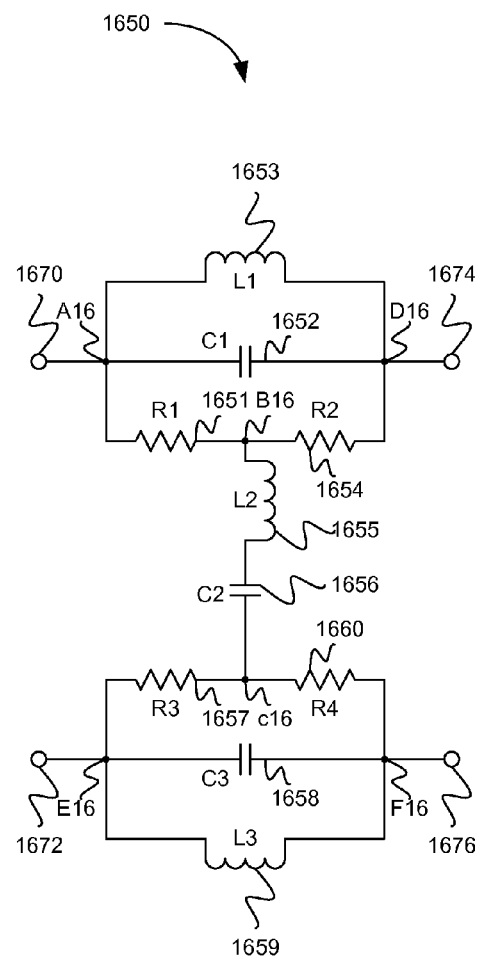

FIGS. 16A and 16B illustrate a bi-directional constant impedance bandreject (notch) bridged-tee form filter in single ended and balanced forms according to one embodiment of the present invention. Circuit 1600 includes capacitors 1602 and 1606, resistors 1601 and 1604, inductors 1603 and 1605, input lines 1620 and 1622, and output lines 1624 and 1626. In one embodiment, resistor 1601 is coupled between a first node A16 and a second node B16. Inductor 1605 and capacitor 1606 are coupled in series between the second node B16 and a third node c16. Capacitor 1602 and inductor 1603 are coupled in parallel between the first node A16 and a fourth node D16. Resistor 1604 is coupled between the second node B16 and the fourth node D16. Input line 1620 is coupled to the first node A16, input line 1622 is coupled to the third node c16, output line 1624 is coupled to the fourth node D16, and output line 1626 is coupled to the third node c16.

In one embodiment, the values of the components in circuit 1600 may be chosen as follows. The value of the first resistor 1601 equals the value of the second resistor 1604 which equals:

$$R1 = R2 = z_0 \tag{81}$$

where $z_0$ is the constant input impedance.

The value of the first inductor 1603 equals:

$$L1 = Q \cdot \frac{z_0}{\omega_c} \tag{82}$$

where $\omega_c$ is the desired pole frequency and Q is the quality factor of the filter.

The value of the second inductor 1605 equals:

$$L2 = \frac{1}{Q} \cdot \frac{z_0}{\omega_c} \tag{83}$$

The value of the first capacitor 1602 equals:

$$C1 = \frac{1}{Q} \cdot \frac{1}{z_0 \cdot \omega_c} \tag{84}$$

The value of the second capacitor 1606 equals:

$$C2 = Q \cdot \frac{1}{z_0 \cdot \omega_c} \tag{85}$$

These values result in a transfer response (H(s)) for the filter as shown in equation 86.

$$H(s) = \frac{s^2 + \omega_c^2}{s^2 + Q \cdot s \cdot \omega_c + \omega_c^2} \tag{86}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 16B, circuit 1650 includes capacitors 1652, 1656 and 1658, resistors 1651, 1654, 1657 and 1660, inductors 1653, 1655 and 1659, input lines 1670 and 1672, and output lines 1674 and 1676. In one embodiment, resistor 1651 is coupled between a first node A16 and a second node B16. Inductor 1655 and capacitor 1656 are coupled in series between the second node B16 and a third node c16. Capacitor 1652 and inductor 1653 are coupled in parallel between the first node A16 and a fourth node D16. Resistor 1654 is coupled between the second node B16 and the fourth node D16. Resistor 1657 is coupled between the third node c16 and a fifth node E16. Resistor 1660 is coupled between the third node c16 and a sixth node F16. Capacitor 1658 and inductor 1659 are coupled in parallel between the fifth node E16 and a sixth node F16. Input line 1670 is coupled to the first node A16, input line 1672 is coupled to the fifth node E16, output line 1674 is coupled to the fourth node D16, and output line 1676 is coupled to the sixth node F16.

In one embodiment, the values of the components in circuit 1650 may be chosen in a manner similar to that discussed above with respect to FIG. 16A. The component values for FIG. 16B will be similar to those in FIG. 16A with several exceptions. Resistors 1651, 1654, 1657 and 1660 have a resistance value that is one half the value of resistor 1601. Capacitors 1652 and 1658 have capacitance values equal to two times the value of capacitor 1602. Inductors 1653 and 1659 have inductance values equal to one half the value of inductor 1603. The values of inductor 1655 and capacitor 1656 remain the same as components 1605 and 1606 respectively. Given these component values, the transfer function will be the same as shown above in equation 86.

Figure 17A:
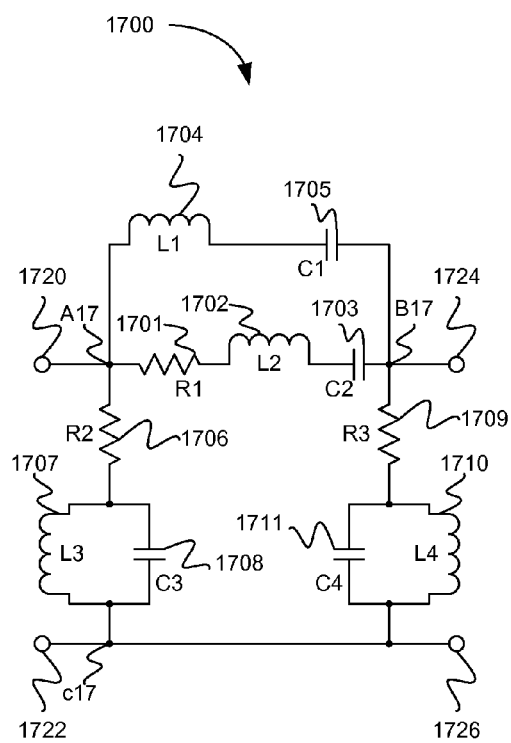
FIGS. 17A and 17B illustrate a bi-directional constant impedance bandpass pi form filter in single ended and balanced forms.
Figure 17B:
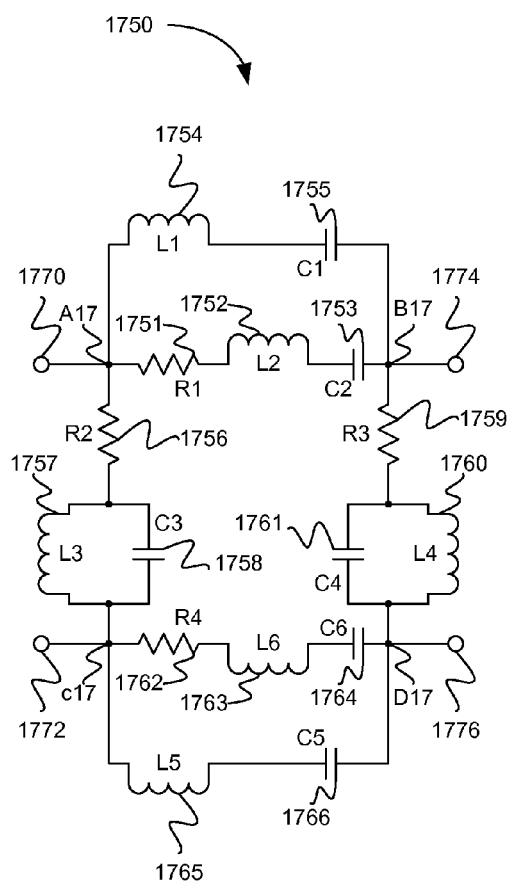

FIGS. 17A and 17B illustrate a bi-directional constant impedance bandpass pi form filter in single ended and balanced forms according to one embodiment of the present invention. Circuit 1700 includes capacitors 1703, 1705, 1708 and 1711, resistors 1701, 1706, and 1709, inductors 1702, 1704, 1707 and 1710, input lines 1720 and 1722, and output lines 1724 and 1726. In one embodiment, resistor 1701, inductor 1702 and capacitor 1703, coupled in series, and inductor 1704 and capacitor 1705, coupled in series, are coupled in parallel between a first node A17 and a second node B17. Resistor 1706 and inductor 1707 and capacitor 1708, coupled in parallel, are coupled in series between the first node A17 and a third node c17. Resistor 1709 and inductor 1710 and capacitor 1711, coupled in parallel, are coupled in series between the second node B17 and the third node c17. Input line 1720 is coupled to the first node A17, input line 1722 is coupled to the third node c17, output line 1724 is coupled to the second node B17, and output line 1726 is coupled to the third node c17.

In one embodiment, the values of the components in circuit 1700 may be chosen as follows. The value of the first resistor 1701 equals:

$$R1 = 2z_0 \tag{87}$$

where $z_0$ is the constant input impedance.

The value of the second resistor 1706 equals the value of the third resistor 1709 which equals:

$$R2 = R3 = z_0 \tag{88}$$

The value of the first inductor 1704 equals the value of the second inductor 1702 which equals:

$$L1 = L2 = Q \cdot \frac{z_0}{\omega_c} \tag{89}$$

where $\omega_c$ is the desired pole frequency and Q is the quality factor of the filter.

The value of the third inductor 1707 equals the value of the fourth inductor 1710 which equals:

$$L3 = L4 = \frac{2}{Q} \cdot \frac{z_0}{\omega_c} \tag{90}$$

The value of the first capacitor 1705 equals the value of the second capacitor 1703 which equals:

$$C1 = C2 = \frac{1}{Q} \cdot \frac{1}{z_0 \cdot \omega_c} \tag{91}$$

The value of the third capacitor 1708 equals the value of the fourth capacitor 1711 which equals:

$$C3 = C4 = \frac{Q}{2} \cdot \frac{1}{z_0 \cdot \omega_c} \tag{92}$$

These values result in a transfer response (H(s)) for the filter as shown in equation 93.

$$H(s) = \frac{s \cdot \omega_c}{Q \cdot s^2 + s \cdot \omega_c + Q \cdot \omega_c^2} \tag{93}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 17B, circuit 1750 includes capacitors 1753, 1755, 1758, 1761, 1764 and 1766, resistors 1751, 1756, 1759 and 1762, inductors 1752, 1754, 1757, 1760, 1763 and

1765, input lines 1770 and 1772, and output lines 1774 and 1776. In one embodiment, resistor 1751, inductor 1752 and capacitor 1753, coupled in series, and inductor 1754 and capacitor 1755, coupled in series, are coupled in parallel between a first node A17 and a second node B17. Resistor 1756 and inductor 1757 and capacitor 1758, coupled in parallel, are coupled in series between the first node A17 and a third node c17. Resistor 1759 and inductor 1760 and capacitor 1761, coupled in parallel, are coupled in series between the second node B17 and a fourth node D17. Resistor 1762, inductor 1763 and capacitor 1764, coupled in series, and inductor 1765 and capacitor 1766, coupled in series, are coupled in parallel between the third node c17 and the fourth node D17. Input line 1770 is coupled to the first node A17, input line 1772 is coupled to the third node C17, output line 1774 is coupled to the second node B17, and output line 1776 is coupled to the fourth node D17.

In one embodiment, the values of the components in circuit 1750 may be chosen in a manner similar to that discussed above with respect to FIG. 17A. The component values for FIG. 17B will be similar to those in FIG. 17A with several exceptions. Resistors 1751 and 1762 have a resistance value that is one half the value of resistor 1701. Capacitors 1753, 1755, 1764 and 1766 have capacitance values equal to two times the value of capacitor 1703. Inductors 1752, 1754, 1763 and 1765 have inductance values equal to one half the value of inductor 1702. The values of resistors 1756 and 1759, inductors 1757 and 1760 and capacitors 1758 and 1761 remain the same as components 1706, 1709, 1707, 1710, 1708 and 1711 respectively. Given these component values, the transfer function will be the same as shown above in equation 93.

Figure 18A:
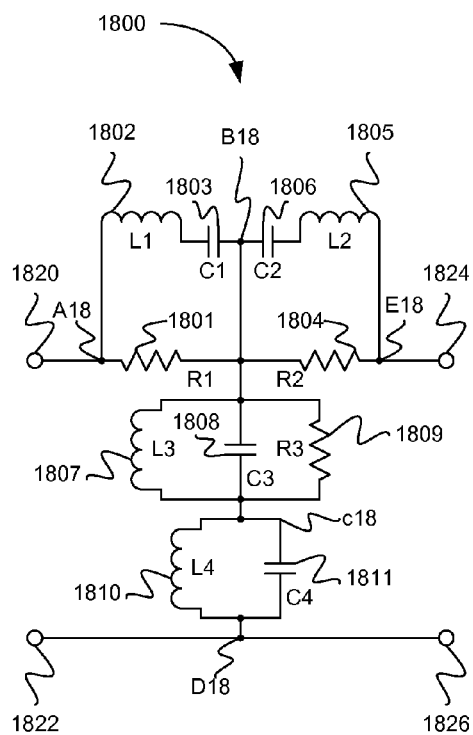
FIGS. 18A and 18B illustrate a bi-directional constant impedance bandpass tee form filter in single ended and balanced forms.
Figure 18B:
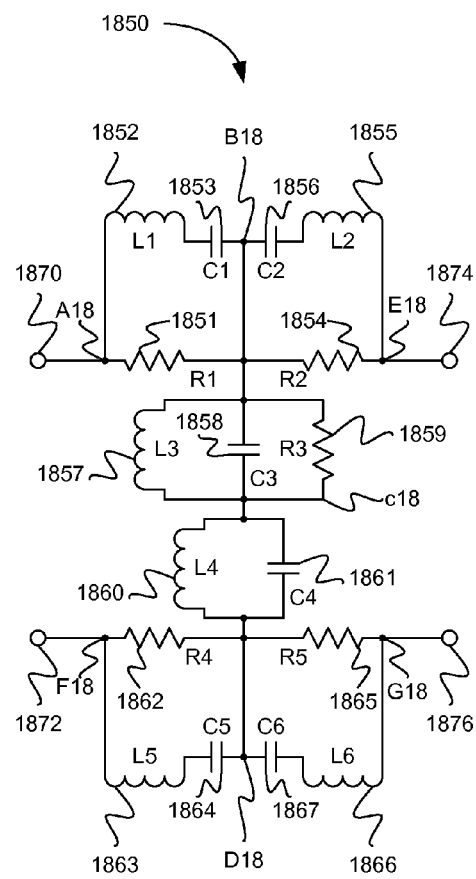

FIGS. 18A and 18B illustrate a bi-directional constant impedance bandpass tee form filter in single ended and balanced forms according to one embodiment of the present invention. Circuit 1800 includes inductors 1802, 1805, 1807 and 1810, resistors 1801, 1804 and 1809, capacitors 1803, 1806, 1808 and 1811, input lines 1820 and 1822, and output lines 1824 and 1826. In one embodiment, resistor 1801 and inductor 1802 and capacitor 1803, coupled in series, are coupled in parallel between a first node A18 and a second node B18. Inductor 1807, capacitor 1808 and resistor 1809 are coupled in parallel between the second node B18 and a third node c18. Inductor 1810 and capacitor 1811 are coupled in parallel between the third node c18 and a fourth node D18. Resistor 1804 and inductor 1805 and capacitor 1806, coupled in series, are coupled in parallel between the second node B18 and a fifth node E18. Input line 1820 is coupled to the first node A18, input line 1822 is coupled to the fourth node D18, output line 1824 is coupled to the fifth node E18, and output line 1826 is coupled to the fourth node D18.

In one embodiment, the values of the components in circuit 1800 may be chosen as follows. The value of the first resistor 1801 equals the value of the second resistor 1804 which equals:

$$R1 = R2 = z_0 \tag{94}$$

where $z_0$ is the constant input impedance.

The value of the third resistor 1809 equals:

$$R3 = \frac{z_0}{2} \tag{95}$$

The value of the first inductor 1802 equals the value of the second inductor 1805 which equals:

$$L1 = L2 = \frac{Q}{2} \cdot \frac{z_0}{\omega_c} \tag{96}$$

where $\omega_c$ is the desired pole frequency and Q is the quality factor of the filter.

The value of the third inductor 1807 equals the value of the fourth inductor 1810 which equals:

$$L3 = L4 = \frac{1}{Q} \cdot \frac{z_0}{\omega_c} \tag{97}$$

The value of the first capacitor 1803 equals the value of the second capacitor 1806 which equals:

$$C1 = C2 = \frac{2}{Q} \cdot \frac{1}{z_0 \cdot \omega_c} \tag{98}$$

The value of the third capacitor 1808 equals the value of the fourth capacitor 1811 which equals:

$$C3 = C4 = Q \cdot \frac{1}{z_0 \cdot \omega_c} \tag{99}$$

These values result in a transfer response (H(s)) for the filter as shown in equation 100.

$$H(s) = \frac{s \cdot \omega_c}{Q \cdot s^2 + s \cdot \omega_c + Q \cdot \omega_c^2} \tag{100}$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 18B, circuit 1800 includes inductors 1852, 1855, 1857, 1860, 1863 and 1866, resistors 1851, 1854, 1859, 1862 and 1865, capacitors 1853, 1856, 1858, 1861, 1864 and 1867, input lines 1870 and 1872, and output lines 1874 and 1876. In one embodiment, resistor 1851 and inductor 1852 and capacitor 1853, coupled in series, are coupled in parallel between a first node A18 and a second node B18. Inductor 1857, capacitor 1858 and resistor 1859 are coupled in parallel between the second node B18 and a third node c18. Inductor 1860 and capacitor 1861 are coupled in parallel between the third node c18 and a fourth node D18. Resistor 1854 and inductor 1855 and capacitor 1856, coupled in series, are coupled in parallel between the second node B18 and a fifth node E18. Resistor 1862 and inductor 1863 and capacitor 1864, coupled in series, are coupled in parallel between the fourth node D18 and a sixth node F18. Resistor 1865 and inductor 1866 and capacitor 1867, coupled in series, are coupled in parallel between the fourth node D18 and a seventh node G18. Input line 1870 is coupled to the first node A18, input line 1872 is coupled to the sixth node F18, output line 1874 is coupled to the fifth node E18, and output line 1876 is coupled to the seventh node G18.

In one embodiment, the values of the components in circuit 1850 may be chosen in a manner similar to that discussed above with respect to FIG. 18A. The component values for FIG. 18B will be similar to those in FIG. 18A with several exceptions. Resistors 1851, 1854, 1862 and 1865 have a resistance value that is one half the value of resistor 1801. Capacitors 1853, 1856, 1864 and 1867 have capacitance values equal to two times the value of capacitor 1803. Inductors 1852, 1855, 1863 and 1866 have inductance values equal to one half the value of inductor 1802. The values of resistor 1859, inductors 1857 and 1860 and capacitors 1858 and 1861 remain the same as components 1809, 1807, 1810, 1808 and 1811 respectively. Given these component values, the transfer function will be the same as shown above in equation 100.

Figure 19A:
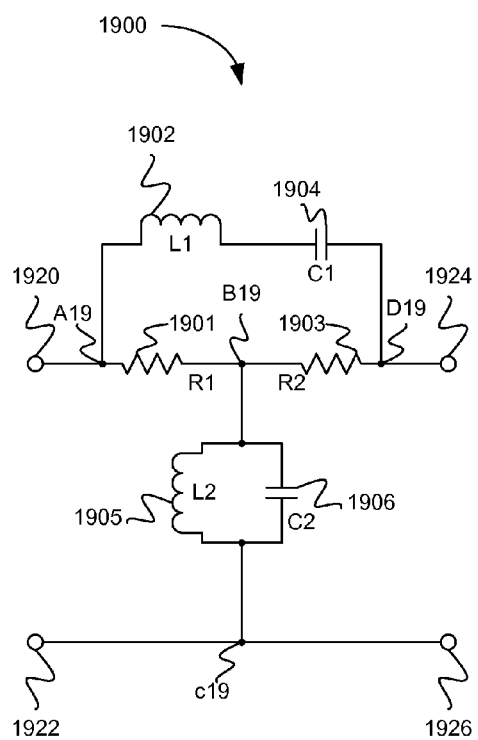
FIGS. 19A and 19B illustrate a bi-directional constant impedance bandpass bridged-tee form filter in single ended and balanced forms.
Figure 19B:
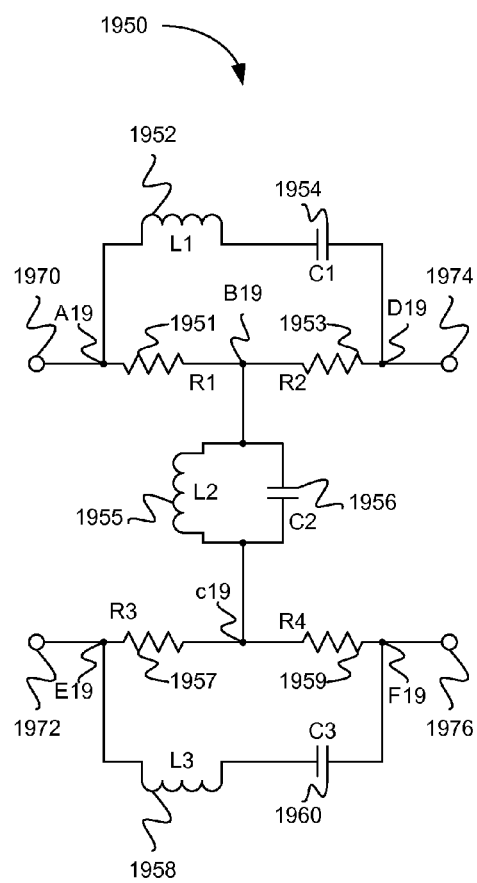

FIGS. 19A and 19B illustrate a bi-directional constant impedance bandpass bridged-tee form filter in single ended and balanced forms according to one embodiment of the present invention. Circuit 1900 includes capacitors 1904 and 1906, resistors 1901 and 1903, inductors 1902 and 1905, input lines 1920 and 1922, and output lines 1924 and 1926. In one embodiment, resistor 1901 is coupled between a first node A19 and a second node B19. Inductor 1905 and capacitor 1906 are coupled in parallel between the second node B19 and a third node c19. Inductor 1902 and capacitor 1904 are coupled in series between the first node A19 and a fourth node D19. Resistor 1903 is coupled between the second node B19 and the fourth node D19. Input line 1920 is coupled to the first node A19, input line 1922 is coupled to the third node c19, output line 1924 is coupled to the fourth node D19, and output line 1926 is coupled to the third node c19.

In one embodiment, the values of the components in circuit 1900 may be chosen as follows. The value of the first resistor 1901 equals the value of the second resistor 1903 which equals:

$$R1 = R2 = z_0 \quad (101)$$

where $z_0$ is the constant input impedance.

The value of the first inductor 1902 equals:

$$L1 = Q \cdot \frac{z_0}{\omega_c} \quad (102)$$

where $\omega_c$ is the desired pole frequency and Q is the quality factor of the filter.

The value of the second inductor 1905 equals:

$$L2 = \frac{1}{Q} \cdot \frac{z_0}{\omega_c} \quad (103)$$

The value of the first capacitor 1904 equals:

$$C1 = \frac{1}{Q} \cdot \frac{1}{z_0 \cdot \omega_c} \quad (104)$$

The value of the second capacitor 1906 equals:

$$C2 = Q \cdot \frac{1}{z_0 \cdot \omega_c} \quad (105)$$

These values result in a transfer response (H(s)) for the filter as shown in equation 106.

$$H(s) = \frac{s \cdot \omega_c}{Q \cdot s^2 + s \cdot \omega_c + Q \cdot \omega_c^2} \quad (106)$$

The filter is bi-directional and thus, the input impedance looking into the filter from either direction is equal to $z_0$. This is a constant input impedance value and, therefore, it is not dependent on the filter response.

This allows multiple LPF sections to be used in cascade with complete freedom to set any of the pole frequencies arbitrarily without interaction.

Referring to FIG. 19B, circuit 1950 includes capacitors 1954, 1956 and 1960, resistors 1951, 1953, 1957 and 1959, inductors 1952, 1955 and 1958, input lines 1970 and 1972, and output lines 1974 and 1976. In one embodiment, resistor 1951 is coupled between a first node A19 and a second node B19. Inductor 1955 and capacitor 1956 are coupled in parallel between the second node B19 and a third node c19. Inductor 1952 and capacitor 1954 are coupled in series between the first node A19 and a fourth node D19. Resistor 1953 is coupled between the second node B19 and the fourth node D19. Resistor 1957 is coupled between the third node c19 and a fifth node E19. Resistor 1959 is coupled between the third node c19 and a sixth node F19. Inductor 1958 and capacitor 1960 are coupled in series between the fifth node E19 and the sixth node F19. Input line 1970 is coupled to the first node A19, input line 1972 is coupled to the fifth node E19, output line 1974 is coupled to the fourth node D19, and output line 1976 is coupled to the sixth node F19.

In one embodiment, the values of the components in circuit 1950 may be chosen in a manner similar to that discussed above with respect to FIG. 19A. The component values for FIG. 19B will be similar to those in FIG. 19A with several exceptions. Resistors 1951, 1953, 1957 and 1959 have a resistance value that is one half the value of resistor 1901. Capacitors 1954 and 1960 have capacitance values equal to two times the value of capacitor 1904. Inductors 1952 and 1958 have inductance values equal to one half the value of inductor 1902. The values of inductor 1955 and capacitor 1956 remain the same as components 1905 and 1906 respectively. Given these component values, the transfer function will be the same as shown above in equation 106.

It should be noted that any of the above structures can be concatenated, that is placed in series, in any number and in any order, without interaction. The pole and zero frequencies can be set independently and arbitrarily, and the impedances at both ends of the resulting filter (and at all nodes between the sections) will remain constant over all frequencies, assuming that the concatenated structure is driven and loaded with $z_0$ Ohms. In one embodiment, single-ended sections are concatenated with other single ended sections, and likewise when balanced differential forms are concatenated with other balanced differential forms.

The filter structures and constant impedance topologies discussed herein may have utility in filtering applications such as telecommunication line simulation. In alternative embodiments, the filter structures may be used in any digital or analog transmission system that is bidirectional and requires filtering, such as, for example, between a radio transceiver and antenna, between modems, for compensating a transmission line for high frequency roll-off, for bandreject or bandpass filtering of measurement signals so as to reject an interfering signal that could cause overload in test instruments, or for analog video signal equalization.

In one embodiment, the methods described above may be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, or any type of media suitable for storing electronic instructions. The information representing the apparatuses and/or methods stored on the machine-readable medium may be used in the process of creating the apparatuses and/or methods described herein.

While some specific embodiments of the invention have been shown the invention is not to be limited to these embodiments. The invention is to be understood as not limited by the specific embodiments described herein, but only by the scope of the appended claims.

What is claimed is:

1. An apparatus comprising:
a first bi-directional constant impedance filter, wherein the bi-directional constant impedance filter comprises:
a first port coupled to one of a source or a load having a first impedance, wherein the first port is configured to constantly present the first impedance to a signal received at the first port for a plurality of frequencies; and
a second port coupled to the other of the source or the load having the first impedance, wherein the second port is configured to constantly present the first impedance to a signal received at the second port for a plurality of frequencies; and
a second bi-directional constant impedance filter coupled in series with the first bi-directional constant impedance filter to form a filter structure, wherein the first and second bi-directional constant impedance filters are non-interacting and wherein the filter structure presents the first impedance to a signal received at an input and at an output.

2. The apparatus of claim 1, further comprising:
a third bi-directional constant impedance filter coupled in series with the first and second bi-directional constant impedance filters to form a second filter structure, wherein the first, second and third bi-directional constant impedance filters are non-interacting and wherein the second filter structure presents the first impedance to a signal received at an input and at an output.

3. The apparatus of claim 1, wherein the first bi-directional constant impedance filter comprises a low pass filter.

4. The apparatus of claim 3, wherein the low pass filter comprises a pi form filter, a tee form filter or a bridged-tee form filter.

5. The apparatus of claim 4, wherein the bridged-tee form filter comprises:
a first inductor coupled between a first node and a second node;
a first resistor coupled between the first node and a third node;
a first capacitor coupled between the third node and a fourth node; and
a second resistor coupled between the second node and the third node.

6. The apparatus of claim 5, wherein the bridged-tee form filter further comprises:
a third resistor coupled between the fourth node and a fifth node;
a fourth resistor coupled between the fourth node and a sixth node; and
a second inductor coupled between the fifth node and the sixth node.

7. The apparatus of claim 1, wherein the bi-directional constant impedance filter comprises a pole/zero filter.

8. The apparatus of claim 7, wherein the pole/zero filter comprises a pi form filter, a tee form filter or a bridged-tee form filter.

9. The apparatus of claim 1, wherein the bi-directional constant impedance filter comprises a high pass filter.

10. The apparatus of claim 9, wherein the high pass filter comprises a pi form filter, a tee form filter or a bridged-tee form filter.

11. The apparatus of claim 1, wherein the bi-directional constant impedance filter comprises a zero/pole filter.

12. The apparatus of claim 11, wherein the zero/pole filter comprises a pi form filter, a tee form filter or a bridged-tee form filter.

13. The apparatus of claim 1, wherein the bi-directional constant impedance filter comprises a bandreject filter.

14. The apparatus of claim 13, wherein the bandreject filter comprises a pi form filter, a tee form filter or a bridged-tee form filter.

15. The apparatus of claim 14, wherein the bridged-tee form filter comprises:
a first resistor coupled between a first node and a second node;
a first inductor and a first capacitor coupled in series between the second node and a third node;
a second capacitor and a second inductor coupled in parallel between the first node and a fourth node; and
a second resistor coupled between the second node and the fourth node.

16. The apparatus of claim 15, wherein the bridged-tee form filter further comprises:
a third resistor coupled between the third node and a fifth node;
a fourth resistor coupled between the third node and a sixth node;
a third capacitor and a third inductor coupled in parallel between the fifth node and the sixth node.

17. The apparatus of claim 1, wherein the bi-directional constant impedance filter comprises a bandpass filter.

18. The apparatus of claim 17, wherein the bandpass filter comprises a pi form filter, a tee form filter, or a bridged-tee form filter.

19. The apparatus of claim 18, wherein the bridged-tee form filter comprises:
a first resistor coupled between a first node and a second node;
a first inductor and a first capacitor coupled in parallel between the second node and a third node;
a second inductor and a second capacitor coupled in series between the first node and a fourth node; and
a second resistor coupled between the second node and the fourth node.

20. The apparatus of claim 19, wherein the bridged-tee form filter further comprises:
a third resistor coupled between the third node and a fifth node;

a fourth resistor coupled between the third node and a sixth node; and a third inductor and a third capacitor coupled in series between the fifth node and the sixth node.

21. The apparatus of claim 1, wherein the constant impedance is approximately 100 ohms.

* * * * *